(12) United States Patent
Elmallah et al.

(10) Patent No.: US 12,381,563 B2
(45) Date of Patent: Aug. 5, 2025

(54) DIGITAL PHASE-LOCKED LOOP AND RELATED MERGED DUTY CYCLE CALIBRATION SCHEME FOR FREQUENCY SYNTHESIZERS

(71) Applicant: MEDIATEK INC.

(72) Inventors: Ahmed Safwat Mohamed Aboelenein Elmallah, San Jose, CA (US); Mohammed Mohsen Abdulsalam Abdullatif, San Jose, CA (US); Tamer Mohammed Ali, San Jose, CA (US)

(73) Assignee: MEDIATEK INC., Hsinchu (TW)

( * ) Notice: Subject to any disclaimer, the term of this patent is extended or adjusted under 35 U.S.C. 154(b) by 100 days.

(21) Appl. No.: 18/497,685

(22) Filed: Oct. 30, 2023

(65) Prior Publication Data

US 2024/0171181 A1    May 23, 2024

Related U.S. Application Data

(60) Provisional application No. 63/384,616, filed on Nov. 22, 2022.

(51) Int. Cl.
*H03L 7/08* (2006.01)
*H03K 3/033* (2006.01)
(Continued)

(52) U.S. Cl.
CPC ........... *H03L 7/0812* (2013.01); *H03K 3/033* (2013.01); *H03K 5/00006* (2013.01); *H04B 1/16* (2013.01)

(58) Field of Classification Search
CPC ..... H03L 7/0812; H03L 7/1987; H03L 7/081; H03K 3/017; H03K 3/033; H03K 5/00006;
(Continued)

(56) References Cited

U.S. PATENT DOCUMENTS 10,505,553 B1 * 12/2019 Steffen ................. H03K 19/21
10,979,057 B1 *  4/2021 Sun ........................ H03L 7/091
(Continued)

OTHER PUBLICATIONS

Coombs et al., 8.6 A 2.5-to-5.75 GHz 5mW 0.3 ps rms-jitter cascaded ring-based digital injection-locked clock multiplier in 65nm CMOS. 2017 IEEE International Solid-State Circuits Conference (ISSCC). Feb. 5, 2017:152-53.

*Primary Examiner* — Dac V Ha
(74) *Attorney, Agent, or Firm* — Winston Hsu

(57) ABSTRACT

The techniques described herein relate to duty cycle error calibration. An example apparatus includes a multi-modulus divider (MMD) circuit configured to receive a first digital code corresponding to a first time delay and included in a first plurality of digital codes associated with a first range of time delays, divide a clock signal by a divisor to generate a divided clock signal, and delay the divided clock signal by the first time delay to generate a delayed clock signal. The apparatus may further include a digitally controlled delay line (DCDL) circuit configured to receive a second digital code corresponding to a second time delay and included in a second plurality of digital codes associated with a second range of time delays, and delay the delayed clock signal by the second time delay to generate a feedback clock signal to reduce a difference between the feedback and a reference clock signal.

20 Claims, 11 Drawing Sheets

(51) Int. Cl.
*H03K 5/00* (2006.01)
*H03L 7/081* (2006.01)
*H04B 1/16* (2006.01)

(58) Field of Classification Search
CPC ...... H03K 5/131; H03K 5/133; H03K 5/1565; H04B 1/16
See application file for complete search history.

(56) References Cited

U.S. PATENT DOCUMENTS

2011/0080203 A1* 4/2011 Lee .................. H03K 5/131
327/277
2024/0195425 A1* 6/2024 Rahman ................ H03L 7/0814

* cited by examiner

DIGITAL PHASE-LOCKED LOOP AND RELATED MERGED DUTY CYCLE CALIBRATION SCHEME FOR FREQUENCY SYNTHESIZERS

RELATED APPLICATION

This patent claims priority under 35 U.S.C. § 119(e) to U.S. Provisional Application No. 63/384,616, titled "DIGITAL PHASE-LOCKED LOOP AND RELATED MERGED DUTY CYCLE CALIBRATION SCHEME FOR FREQUENCY SYNTHESIZERS," filed on Nov. 22, 2022, which is hereby incorporated by reference herein in its entirety.

FIELD

The techniques described herein relate generally to frequency synthesizers and, more particularly, to digital phase-locked loop and related merged duty cycle calibration scheme for frequency synthesizers.

BACKGROUND

Receivers, such as wireline or wireless signal receivers, are devices that may receive electromagnetic signals. The electromagnetic signals may include high-frequency and low-frequency signal components. Some wireline signal receivers may use frequency synthesizers to generate a waveform at a frequency determined by analog or digital circuits. For instance, a frequency synthesizer may be an electronic device that uses an oscillator to generate a signal with a specific frequency or within a pre-set frequency range. Operation of some such frequency synthesizers may be adversely affected by component and/or system noise.

SUMMARY OF THE DISCLOSURE

Some aspects relate to an example apparatus comprising a multi-modulus divider (MMD) circuit with an output, the MMD circuit configured to receive a first digital code corresponding to a first time delay, the first digital code included in a first plurality of digital codes associated with a first range of time delays, divide a clock signal by a divisor to generate a divided clock signal, and delay the divided clock signal by the first time delay to generate a delayed clock signal. The example apparatus further comprises a digitally controlled delay line (DCDL) circuit with an input coupled to the output, the DCDL circuit configured to receive a second digital code corresponding to a second time delay, the second digital code included in a second plurality of digital codes associated with a second range of time delays, and delay the delayed clock signal by the second time delay to generate a feedback clock signal, the feedback clock signal to cause a reduction of a difference between a reference clock signal and the feedback clock signal.

Some aspects relate to another example apparatus comprising a multi-modulus divider (MMD) circuit with an MMD output, the MMD circuit configured to generate a first delayed clock signal by delaying a clock signal by a first time delay associated with a first range of time delays. The example apparatus further comprises a retimer circuit with a retimer input and a retimer output, the retimer input coupled to the MMD output, the retimer circuit configured to generate a second delayed clock signal by delaying the first delayed clock signal by a second time delay associated with a second range of time delays. The example apparatus further comprises a digitally controlled delay line (DCDL) circuit with a DCDL input coupled to the retimer output, the DCDL circuit configured to generate a third delayed clock signal by a third time delay associated with a third range of time delays.

Some aspects relate to an example method comprising receiving a reference clock signal, comparing the reference clock signal and a feedback clock signal to detect an error and, in response to detecting the error based on the comparing, determining whether the error is greater than a threshold. The example method further comprises in response to determining that the error is greater than the threshold, increasing a first range of time delays to a second range of time delays from which to select a time delay to delay the feedback clock signal, and delaying the feedback clock signal using the time delay to reduce the error.

The foregoing summary is not intended to be limiting. Moreover, various aspects of the present disclosure may be implemented alone or in combination with other aspects.

BRIEF DESCRIPTION OF FIGURES

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

Figure 1:
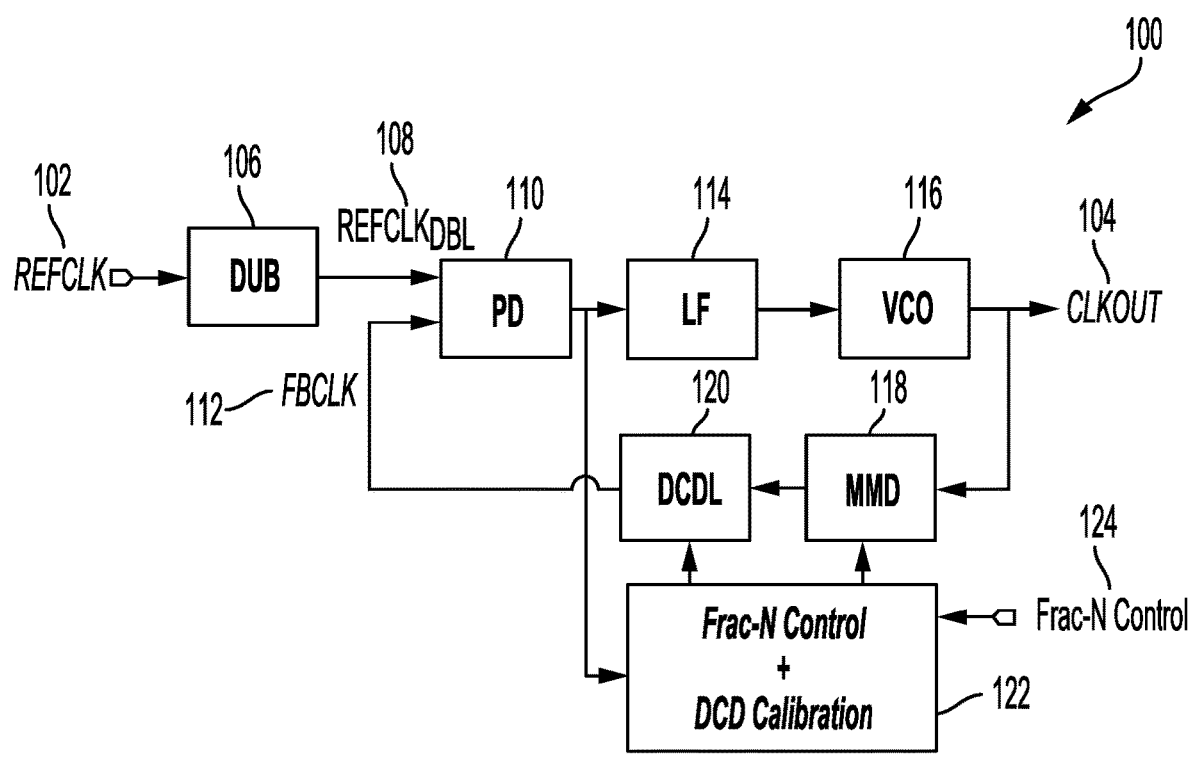
FIG. 1 depicts a schematic illustration of an example phase-locked loop including a multi-modulus divider and a digitally controlled delay line to reduce duty cycle distortion of the phase-locked loop.

Phase-locked loop (PLL) circuits are used in a wide variety of high frequency applications. Non-limiting examples of high frequency applications include clock clean-up circuits, local oscillators (LOs) for high performance communication links, and ultrafast switching frequency synthesizers. Non-limiting examples of high-performance communication links include wireline communication links, such as Ethernet links, and wireless communication links, such as radiofrequency (RF), radar, and satellite communication links. Some PLL circuits include an oscillator (e.g., a digitally controlled oscillator (DCO), a voltage-controlled oscillator (VCO), a voltage-driven oscillator (VDO)) that adjusts (e.g., constantly adjusts) to match the frequency of an input signal. For example, some such PLL circuits may be used to generate, stabilize, modulate, demodulate, filter, or recover a signal from a communications channel from which the reception of data may be affected by noise associated with the communications channel.

One challenge of using a PLL circuit with an oscillator, such as a DCO, is that the oscillator is typically the most power consuming block of the PLL circuit. For example, a DCO may be an oscillator circuit that generates an analog signal, but whose frequency is controlled by a digital control input generated by a digital-to-analog converter. A VCO may be an oscillator circuit that generates an analog signal and whose frequency is controlled by an analog control input, such as a control voltage. In these examples, a DCO may consume more power than the VCO and/or, more generally, more power than other component(s) of the PLL circuit.

Another challenge of using a PLL circuit with an oscillator, such as a DCO, is that the oscillator may introduce substantial noise into the PLL circuit, and/or, more generally, into a system that includes the PLL circuit. A conventional technique for reducing noise associated with the DCO is increasing the PLL bandwidth. However, a challenge of using such a conventional technique is that the PLL bandwidth is limited by the reference clock frequency ($F_{REF}$) (e.g., the frequency of the input signal to the PLL circuit). For example, the noise bandwidth (NBW) may be approximated by $F_{REF}/10$ and the NBW is limited by $F_{REF}$.

A conventional technique for increasing the reference clock frequency, and thereby increasing the PLL bandwidth, is using a frequency doubler. One challenge of using a frequency doubler is that the frequency doubler may introduce duty cycle distortion. For example, the frequency doubler may introduce deterministic jitter into the PLL circuit, which can cause the rising edges of the reference clock signal to be respectively delayed (or advanced) by a first delay value from the expected moment in time and cause the falling edges of the reference clock signal to be respectively delayed (or advanced) by a second delay value from the expected moment in time. For example, a change in the duty cycle of a clock generator that generates the reference clock signal may be +1-5%. For a 156.25-megahertz (MHz) clock generator, the deterministic jitter introduced by the frequency doubler may be +/−320 picoseconds (ps), which is substantially large enough such that the use of the frequency doubler may cause erroneous operation of the PLL circuit. In some systems, the duty cycle distortion may be converted to a spur at $F_{REF}$, which can shift a sampling instant of $F_{REF}$ and thereby degrade the sampling of $F_{REF}$ and cause erroneous operation of the PLL circuit.

The inventors have recognized that the aforementioned challenges have not been overcome by using conventional techniques, such as increasing the PLL bandwidth and/or using a frequency doubler. To overcome the deficiencies of the conventional techniques, the inventors have developed technology for digital phase-locked loops and a related merged duty cycle calibration scheme for frequency synthesizers.

Example digital PLLs disclosed herein include a VCO to generate an output clock frequency. The use of a VCO can overcome the challenges of using a DCO by consuming less power than the DCO. Example digital PLLs disclosed herein include a multi-modulus divider (MMD), and a digitally controlled delay line (DCDL) as an infinite range (e.g., a substantially large range) digital-to-time converter (DTC). For example, the DTC can receive an output clock signal from the VCO, delay the output clock signal by a time delay to generate a feedback clock signal, and provide the feedback clock signal to a phase detector of the PLL circuit for comparison. In some embodiments, control of the DCDL can achieve a first time delay in a range of 0 to one time period of the VCO ($T_{VCO}$). In some embodiments, control of the MMD can achieve a second time delay in a range of 0 to $T_{VCO}$. For example, the DTC can generate the feedback clock signal by delaying the output clock frequency by a total time delay based on a combination of the first time delay and the second time delay (e.g., a total time delay up to $2T_{VCO}$ (e.g., $2*T_{VCO}$)). For example, the MMD can extend a first time delay range achievable by the DCDL to a second time delay range. In some embodiments, control of at least one of the DCDL or the MMD can generate a time delay in a time delay range up to at least the second time delay range.

In some embodiments, the time delay needed to lock the reference clock signal to the feedback clock signal is greater than $2T_{VCO}$. Beneficially, the DTC can operate as an infinite range DTC by increasing the time delay range through resetting control of the DCDL (e.g., resetting a digital code output by the DCDL to 0) and changing a configuration of the MMD to further divide the feedback clock signal. For example, the DTC can achieve time delays in time delay ranges up to at least $3T_{VCO}$, $4T_{VCO}$, $5T_{VCO}$, etc., by changing configurations of the DCDL and/or the MMD to increase (e.g., iteratively increase) the total achievable delay.

In some embodiments, digital PLLs disclosed herein can include a retimer to achieve additional time delay and thereby extend a time delay range that the DCDL and the MMD can provide. For example, a digital PLL disclosed herein can include an MMD, a retimer, and a DCDL configurable to achieve a total time delay of at least $3T_{VCO}$. Configuration changes of at least one of the MMD or the DCDL can be implemented to achieve additional time delay, such as time delays in time delay ranges up to at least $4T_{VCO}$, $5T_{VCO}$, $6T_{VCO}$, etc.

Beneficially, example PLL circuits disclosed herein overcome the challenges of conventional techniques. For example, the use of a VCO can reduce the power consumption of the PLL circuit with respect to a PLL circuit using a DCO. In some embodiments, the reference clock frequency can be increased to increase the PLL bandwidth, and the corresponding noise can be mitigated by the example MMD, retimer, and/or DCDL disclosed herein. For example, configurations of at least one of the MMD, the retimer, or the DCDL can increase the time delay applied to the feedback clock signal such that the error associated with the reference clock signal is corrected and/or otherwise reduced. Beneficially, by applying time delays in substantially large time delay ranges, the example PLL circuits can eliminate and/or otherwise reduce the duty cycle distortion introduced by frequency increasers, such as frequency doublers.

Turning to the figures, the illustrated example of FIG. 1 depicts an example phase-locked loop (PLL) 100. The PLL 100 is a circuit that generates an output clock signal 104 (identified by CLKOUT) whose phase is related to a phase of a reference clock signal 102 (identified by REFCLK). For example, the PLL 100 can synchronize and/or lock a phase of the output clock signal 104 with a phase of the reference clock signal 102. In some embodiments, the PLL 100, or portion(s) thereof, can implement a frequency synthesizer that produces a range of frequencies from a single fixed oscillator.

In the illustrated example, the reference clock signal 102 is an input signal that can be transmitted by a transmitter and/or received by a receiver. For example, the PLL 100 can be configured to receive the reference clock signal 102 from a wireline receiver, such as a data communication wireline receiver. Non-limiting examples of wireline receivers include Ethernet interfaces, Peripheral Component Interconnect (PCI) interfaces, Serial Digital Interfaces (SDI), Universal Serial Bus (USB) interfaces, and High-Definition Multimedia Interfaces (HDMI). Alternatively, the PLL 100 can be configured to receive the reference clock signal 102 from a wireless receiver. Non-limiting examples of wireless receivers include Wireless Fidelity (Wi-Fi) receivers, Bluetooth receivers, near-field communication (NFC) receivers, radio-frequency identification (RFID) receivers, and satellite receivers (e.g., beyond-line-of-site (BLOS) satellite receivers, line-of-site (LOS) satellite receivers, etc.).

In some embodiments, the PLL 100 is included in and/or associated with an electronic device. Non-limiting examples of electronic devices include gateways, routers, switches, laptop computers, tablet computers, cellular phones (e.g., smartphones), televisions (e.g., smart televisions), set-top boxes, streaming devices, and wearable devices (e.g., headphones, headsets, smartwatches, smart glasses, etc.). For example, the output clock signal 104 can be provided to additional circuitry, such as a transmitter, a receiver, and/or a programmable processor. Non-limiting examples of programmable processors include central processing units (CPUs), digital signal processors (DSPs), graphics processing units (GPUs), and field programmable gate arrays (FPGAs).

The PLL 100 of the illustrated example includes a frequency doubler 106 (identified by DUB) to double and/or otherwise increase a frequency (e.g., a reference clock frequency, an input clock frequency) of the reference clock signal 102 to generate a doubled reference clock signal 108 (identified by $REFCLK_{DBL}$). In some embodiments, the frequency doubler 106 is a frequency doubler circuit that increases the frequency of the reference clock signal 102 to increase a bandwidth of the PLL 100. In some embodiments, the frequency doubler 106 is implemented by an oscillator (e.g., a reference oscillator, an oscillator circuit) to increase the frequency of the reference clock signal 102. In some embodiments, the frequency doubler 106 can be configured to receive the reference clock signal 102 from a receiver (e.g., a wireline receiver, a wireless receiver). Alternatively, the PLL 100 may utilize a different frequency increaser than the frequency doubler 106 to triple, quadruple, etc., the reference clock signal 102.

The PLL 100 of the illustrated example includes a phase detector 110 (identified by PD and may also be referred to as a phase comparator or mixer) to compare a first phase of the doubled reference clock signal 108 and a second phase of a feedback clock signal 112 (identified by FBCLK). The feedback clock signal 112 can be a delayed instance of the output clock signal 104. In some embodiments, the PD 110 can be a phase detector circuit that can generate and/or output a voltage according to a phase difference of the first and second phases. In some embodiments, the voltage can be an error signal that is representative of an error that is detected between the phases of the doubled reference clock signal 108 and the feedback clock signal 112. The PD 110 of the illustrated example has a first input (e.g., a first detector input, a first phase detector input) coupled to an output (e.g., a doubler output, a frequency doubler output) of the frequency doubler 106. For example, the PD 110 and the frequency doubler 106 can be coupled together through one or more electrical connections. Non-limiting examples of electrical connections include opto-isolators, pads, traces, wires, and vias.

The PLL 100 of this example includes a loop filter 114 (identified by LF). In some embodiments, the LF 114 is a loop filter circuit that converts the output of the PD 110 into a control signal (e.g., a control voltage) for a voltage-controlled oscillator 116 (identified by VCO) of the PLL 100. For example, the PD 110 can be implemented by one or more charge pumps that can output a current representative of the detected error. In some such embodiments, the LF 114 can convert the current from the one or more charge pumps to the control voltage for the VCO 116. Alternatively, the PD 110 may output a voltage representative of the detected error. In some embodiments, the LF 114 can filter out and/or attenuate noise coming from the reference clock signal 102 to the control voltage. The LF 114 of the illustrated example has an input (e.g., a filter input, a loop filter output) coupled to an output (e.g., a detector output, a phase detector output) of the PD 110.

The PLL 100 of this example includes the VCO 116 to generate and/or output the output clock signal 104 according to the control voltage output from the LF 114. In some embodiments, the VCO 116 is a VCO circuit that generates and/or outputs the output clock signal 104. In some embodiments, the output clock signal 104 is a signal (e.g., a sinusoidal signal) whose frequency closely matches the center frequency provided by the LF 114. The VCO 116 of this example has an input (e.g., an oscillator input) coupled to an output (e.g., a filter output, a loop filter output) of the LF 114.

In the illustrated example, the PLL 100 includes a multi-modulus divider 118 (identified by MMD) to divide and/or reduce a frequency of the output clock signal 104. Additionally or alternatively, a pre-division ratio may be included in the PLL 100 prior to the MMD 118. In some embodiments, the MMD 118 can be an MMD circuit that divides a frequency of the output clock signal 104 by a divisor (e.g., 2, 3, 4, etc.) to generate a divided clock signal. For example, the MMD 118 can be implemented using one or more analog and/or digital circuits configured to divide the frequency of the output clock signal 104. In some embodiments, the MMD 118 can delay the divided clock signal by a time delay (e.g., a time duration, a time period) in a time delay range to generate a delayed clock signal. For example, time delays in the time delay range can range from zero time delay to a time delay up to at least a period of the VCO 116 (e.g., $T_{VCO}$). Any other time delay range may be utilized. The MMD 118 of this example has an input (e.g., a divider input, an MMD input) coupled to an output (e.g., an oscillator output) of the VCO 116.

The PLL 100 of the illustrated example includes a digitally controlled delay line (DCDL) 120 to delay the output, such as a divided clock signal, from the MMD 118, by a time delay in a time delay range to generate the feedback clock signal 112. In some embodiments, the DCDL 120 can cause a reduction of a difference (e.g., a difference in phases) of the doubled reference clock signal 108 and the feedback clock signal 112. For example, the difference can be representative of an error generated by duty cycle distortion associated with the doubled reference clock signal 108. In some embodiments, the DCDL 120 is implemented by one or more analog and/or digital circuits. For example, the DCDL 120 can be implemented by one or more buffers (e.g., circular buffers) that implement one or more discrete digital logic elements. Alternatively, the DCDL 120 may be implemented by any other analog and/or digital components or elements.

The DCDL 120 of this example has an output (e.g., a delay line output, a digitally controlled delay line output) coupled to a second input (e.g., a second detector input, a second phase detector input) of the PD 110. Alternatively, one or more portions of the DCDL 120 may be disposed elsewhere in the PLL 100. For example, a first portion of the DCDL 120 can be in circuit with a reference path of the PLL 100, which can be a path that includes at least one of the frequency doubler 106, the PD 110, the LF 114, or the VCO 116. In some embodiments, a second portion of the DCDL 120 can be in circuit with a feedback path of the PLL 100, which can be a path that includes at least one of the VCO 116, the MMD 118, the DCDL 120, or the PD 110.

In some embodiments, the DCDL 120, the MMD 118, and/or, more generally, the PLL 100, can be configured to cause generation of the feedback clock signal 112 to reduce the error. For example, the PLL 100 includes control circuitry 122 (identified by Frac-N Control+DCD Calibration), which can be implemented by one or more control circuits, to configure at least one of the MMD 118 or the DCDL 120 to reduce a difference between the doubled reference clock signal 108 and the feedback clock signal 112. In some embodiments, the reduction of the difference can be implemented by shifting the feedback clock signal 112 to have the same error as the doubled reference clock signal 108.

In some embodiments, the control circuitry 122 implements at least one of fractional-N (Frac-N) control logic or digitally controlled delay (DCD) calibration control logic. In some embodiments, the control circuitry 122 can be digital logic and/or implemented at least in part by digital logic to effectuate Frac-N control or DCD calibration. In some embodiments, the control circuitry 122 can receive control signal(s) 124 (identified by Frac-N Control), such as digital code(s) (e.g., digital code word(s)), to set an initial configuration of the control circuitry 122.

In some embodiments, the control circuitry 122 is configured to receive the error signal from the PD 110. For example, the control circuitry 122 can determine whether the error signal is greater than or less than a voltage threshold (e.g., 0 volts (V), 0.5 V, etc.) for each clock cycle of the PD 110. In some embodiments, the control circuitry 122 can generate a first digital code based on the error signal and output the first digital code to the MMD 118 to change a configuration of the MMD 118. The configuration of the MMD 118 can cause a change in a time delay that the MMD 118 applies to the output clock signal 104. In some embodiments, the control circuitry 122 can generate a second digital code based on the error signal and output the second digital code to the DCDL 120 to change a configuration of the DCDL 120. The configuration of the DCDL 120 can cause a change in a time delay that the DCDL 120 applies to the delayed clock signal from the MMD 118.

In the illustrated example, the control circuitry 122 has an input (e.g., a control input) coupled to an output of the PD 110. In this example, a first output (e.g., a first control output) of the control circuitry 122 is coupled to an input of the MMD 118. In this example, a second output (e.g., a second control output) of the control circuitry 122 is coupled to an input of the DCDL 120.

Beneficially, in some embodiments, Frac-N control and DCD calibration can be combined and/or merged to improve operation of a frequency synthesizer, such as at least part of the PLL 100. For example, Frac-N control and DCD calibration can be combined and/or merged to improve locking of the phases of the doubled reference clock signal 108 and the feedback clock signal 112.

While an example implementation of the PLL 100 is depicted in FIG. 1, other implementations are contemplated. For example, one or more blocks, components, functions, etc., of the PLL 100 may be combined or divided in any other way. The PLL 100 of the illustrated example may be implemented by hardware alone, or by a combination of hardware, software, and/or firmware. For example, the PLL 100 may be implemented by one or more analog circuits (e.g., capacitors, comparators, diodes, inductors, operational amplifiers, resistors, transistors, etc.), one or more digital circuits (e.g., logic gates, etc.), one or more hardware-implemented state machines, one or more programmable processors, one or more application specific integrated circuits (ASICs), etc., and/or any combination(s) thereof. The PLL 100 of the illustrated example can be implemented by one or more integrated circuits (ICs) on the same die or two or more different dies.

Figure 2:
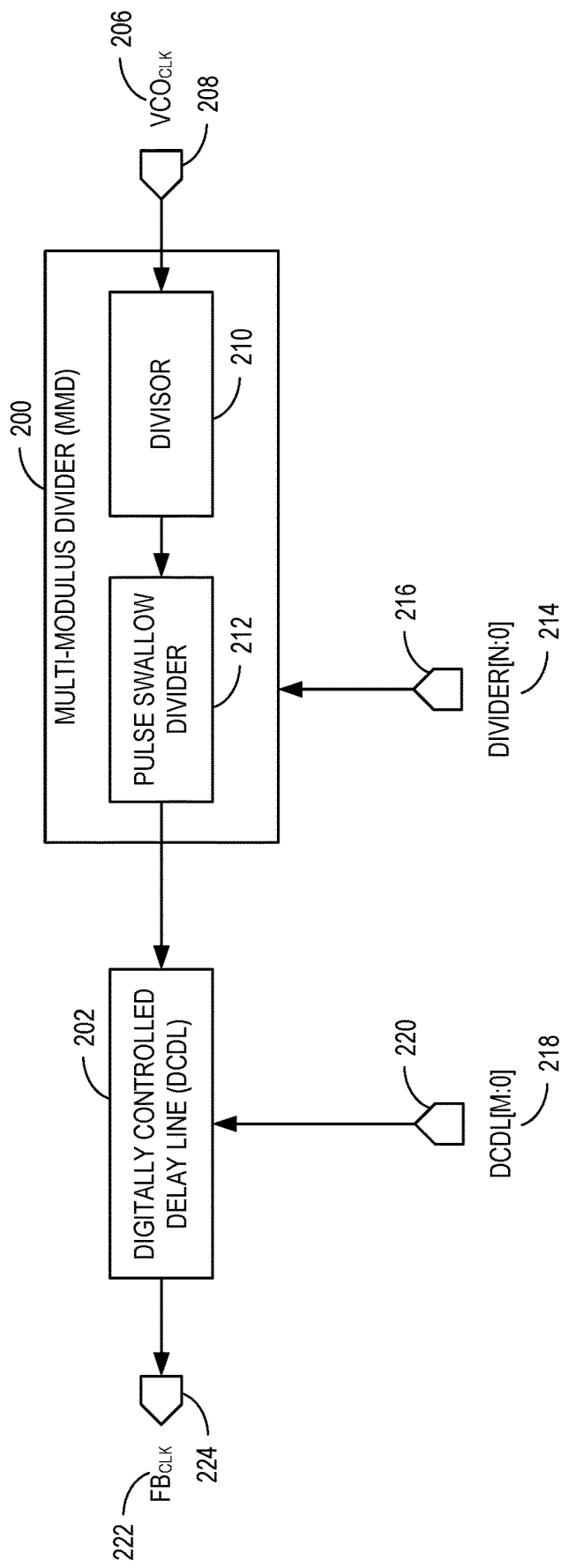
FIG. 2 depicts a schematic illustration of example implementations of the multi-modulus divider and the digitally controlled delay line of FIG. 1.

FIG. 2 depicts a schematic illustration of example implementations of an MMD 200 and a DCDL 202. In some embodiments, the MMD 200 of this example can correspond to and/or implement the MMD 118 of FIG. 1. In some embodiments, the DCDL 202 of this example can correspond to and/or implement the DCDL 120 of FIG. 1.

The MMD 200 of the illustrated example is configured to receive a clock signal 206 (identified by $VCO_{CLK}$) from a VCO, such as the VCO 116 of FIG. 1, via a first input/output (I/O) port 208. In some embodiments, the clock signal 206 of this example can correspond to and/or implement the output clock signal 104 of FIG. 1.

The MMD 200 of this example includes a divisor 210. In some embodiments, the divisor 210 is a divisor circuit that divides a frequency of the clock signal 206 by a divisor (e.g., 2, 3, 4, etc.). For example, the divisor 210 can divide the clock signal 206 by the divisor to generate a divided clock signal. An input (e.g., a divisor input) of the divisor 210 is coupled to the first I/O port 208.

The MMD 200 of this example includes a pulse swallow divider 212. In some embodiments, the pulse swallow divider 212 is a pulse swallow divider circuit that outputs a signal (e.g., a pulse) in response to detecting a count of pulses (e.g., a count of rising edges, a count of falling edges) of the divided clock signal from the divisor 210. For example, the pulse swallow divider 212 can reduce the frequency of the divided clock signal by swallowing (e.g., not passing and/or outputting) a number of pulses of the divided clock signal and outputting a clock signal after the number of swallowed pulses meets or exceeds a count threshold and thereby satisfies the count threshold. In some embodiments, the outputted clock signal can represent a delayed clock signal, such as a delay or delayed version of the divided clock signal from the divisor 210. In this example, an input (e.g., a pulse swallow divider input) of the pulse swallow divider 212 is coupled to an output (e.g., a divisor output) of the divisor 210.

In some embodiments, the control circuitry 122 can output a digital code to the pulse swallow divider 212, and/or, more generally, the MMD 200, to configure the count threshold. For example, the control circuitry 122 can output the digital code as a divider digital code 214 (identified by DIVIDER[N:0]) to instruct the pulse swallow divider 212 to divide the divided clock signal by N+1 or N based on the modulus and/or divider control from the control circuitry 122. For example, the MMD 200 can be configured to receive the divider digital code 214 from the control circuitry 122 via a second I/O port 216.

In the illustrated example, the divider digital code 214 is an N+1 bit digital word. For example, the divider digital code 214 can be a 10-bit digital word that can configure the pulse swallow divider 212 to divide the divided clock signal in a range from 8 to 511. For example, the divider digital code 214 can be a digital code of a plurality of digital codes associated with a first range of time delays. For example, the divider digital code 214 can be a first digital code associated with a first time delay of $T_{VCO}$, a second digital code associated with a second time delay of $2T_{VCO}$, etc. In some embodiments, the first range of time delays can be implemented by a range of 0 (or other value) up to at least $(N+1)*T_{VCO}$.

In some embodiments, the pulse swallow divider 212 can delay the divided clock signal by a time delay in a time delay range based on the swallowing of the number of pulses. For example, the time delay can be implemented by the reduction in the frequency of the divided clock signal based on the number of pulses that the pulse swallow divider 212 is configured to swallow.

By way of example, the time delay range can be implemented by a configuration of the pulse swallow divider 212, and/or, more generally, a configuration of the MMD 200. For example, the control circuitry 122 of FIG. 1 can generate the divider digital code 214 to be 8 or 000000100 in binary (e.g., b'000000100) to configure the pulse swallow divider 212 to output a pulse in response to detecting 8 pulses of the divided clock signal. In some embodiments, the time delay can correspond to a time duration between a rising edge (or falling edge) of the first one of the 8 pulses and a rising edge (or falling edge) of the output pulse. For example, the time delay can be a time duration up to at least one period of the VCO 116 of FIG. 1 ($T_{VCO}$).

By way of another example, the pulse swallow divider 212 can be configured to increase a time delay range in which a time delay can be applied to the divided clock signal. For example, the control circuitry 122 of FIG. 1 can generate the divider digital code 214 to be 16 or 000001000 in binary (e.g., b'000001000) to configure the pulse swallow divider 212 to output a pulse in response to detecting 16 pulses of the divided clock signal. In some embodiments, the time delay can correspond to a time duration between a rising edge (or falling edge) of the first one of the 16 pulses and a rising edge (or falling edge) of the output pulse. For example, the time delay can be a time duration up to at least two periods of the VCO 116 of FIG. 1 ($2T_{VCO}$).

In the illustrated example of FIG. 2, the MMD 200 is coupled to the DCDL 202. For example, an input (e.g., a DCDL input) of the DCDL 202 is coupled to an output (e.g., a divider output, a pulse swallow divider output) of the pulse swallow divider 212, and/or, more generally, the MMD 200 via one or more electrical connections.

In some embodiments, the DCDL 202 is a DCDL circuit that can delay the delayed clock signal from the pulse swallow divider 212 by a time delay in a time delay range. For example, the control circuitry 122 of FIG. 1 can generate and/or output DCDL digital code 218 (identified by DCDL [M:0]) to instruct the DCDL 202 to delay the divided clock signal by a time delay in a time delay range. For example, the DCDL 202 can be configured to receive the DCDL digital code 218 via a third I/O port 220.

In the illustrated example, the DCDL digital code 218 is an M+1 bit digital word. For example, the DCDL digital code 218 can be a 9-bit digital word that can configure the DCDL 202 to divide the divided clock signal in a time delay range from 0 to $T_{VCO}$. By way of example, the DCDL digital code 218 can be 0 or 0000000000 in binary (e.g., b'0000000000) that corresponds to a zero time delay and/or a minimum time delay in a time delay range up to at least $T_{VCO}$. In some embodiments, the DCDL digital code 218 can be 1023 or 1111111111 in binary (e.g., b'1111111111) that corresponds to a time delay of $T_{VCO}$.

In some embodiments, the DCDL digital code 218 can be a digital code of a plurality of digital codes associated with a second range of time delays. For example, the DCDL digital code 218 can be a first digital code associated with a first time delay of $T_{VCO}$, a second digital code associated with a second time delay of $2T_{VCO}$, etc. In some embodiments, the second range of time delays can be implemented by a range of 0 (or other value) up to at least $(M+1)*T_{VCO}$.

In the illustrated example, the DCDL 202 can be configured to delay the divided clock signal from the pulse swallow divider 212 to generate a feedback clock signal 222 (identified by $FB_{CLK}$). In some embodiments, the feedback clock signal 222 can correspond to and/or implement the feedback clock signal 112 of FIG. 1. In the illustrated example, the DCDL 202 can output the feedback clock signal 222 via a fourth I/O port 224. For example, the DCDL 202 can output the feedback clock signal 222 to the second input of the PD 110 via the fourth I/O port 224.

In example operation, the pulse swallow divider 212, and/or, more generally, the MMD 200, can receive the divider digital code 214 to configure the count threshold of the pulse swallow divider 212. For example, the divider digital code 214 can correspond to a first time delay of $T_{VCO}$. The divisor 210 can receive the clock signal 206 from the VCO 116 and divide the clock signal 206 by a divisor to generate a divided clock signal. The pulse swallow divider 212 can delay the divided clock signal by the first time delay to generate a delayed clock signal.

In example operation, the DCDL can receive the DCDL digital code 218 to configure a time delay that the DCDL 202 is to apply to the delayed clock signal. The DCDL 202 can receive the delayed clock signal. The DCDL 202 can delay the delayed clock signal by the time delay to generate the feedback clock signal 222. Beneficially, the feedback clock signal 222 can cause a reduction of a difference between the doubled reference clock signal 108 and the feedback clock signal 112 of FIG. 1. In some embodiments, the difference is representative of an error generated by duty cycle distortion associated with the doubled reference clock signal 108, and, beneficially, the MMD 200 and/or the DCDL 202 can be configured to generate the feedback clock signal 222 to reduce the error.

Figure 3:
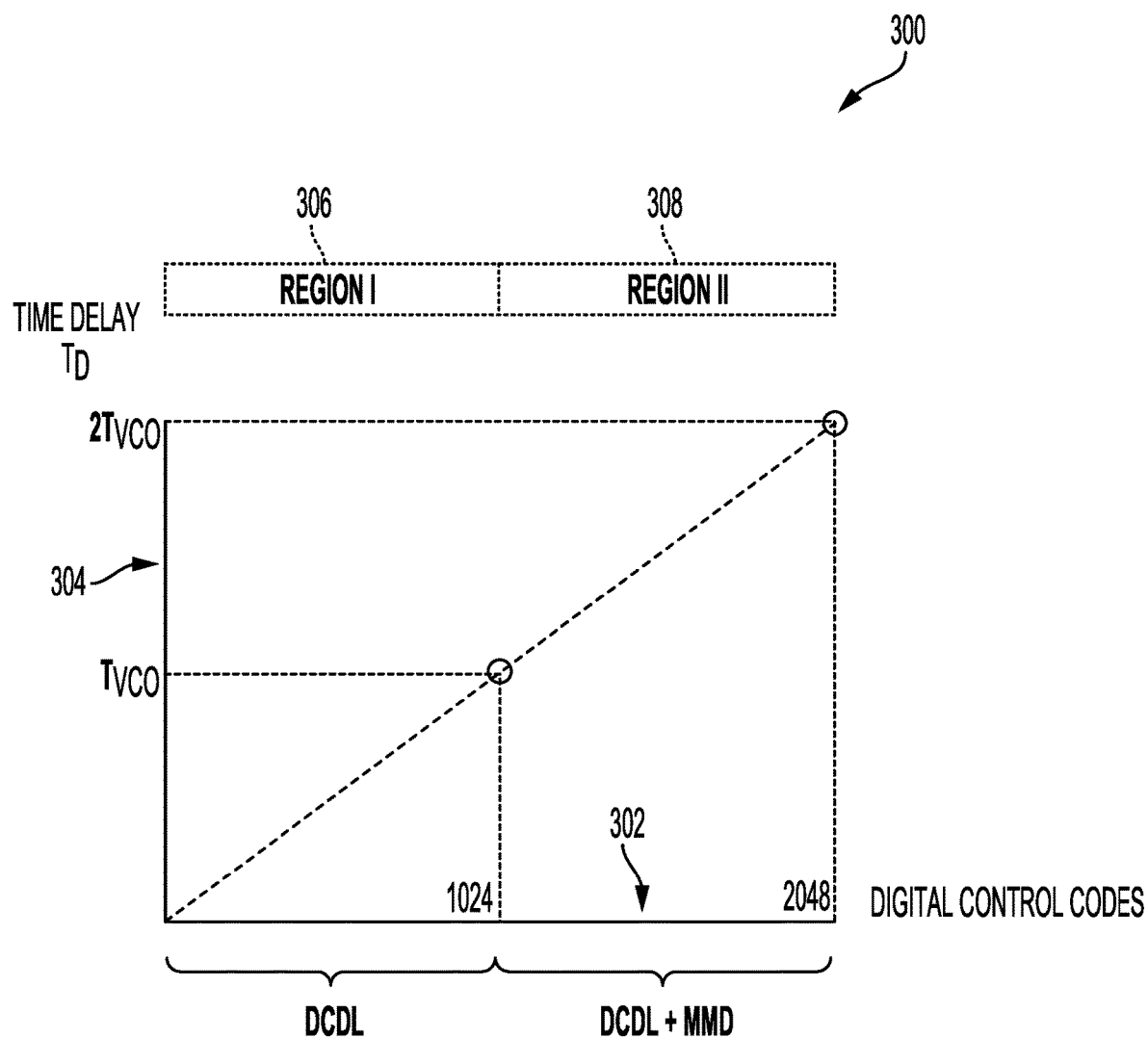
FIG. 3 is a graph of example time delays in example time delay ranges that may be achieved by the phase-locked loop of FIG. 1.

FIG. 3 is a graph 300 of example time delays in example time delay ranges that may be achieved by a PLL, such as the PLL 100 of FIG. 1, or portion(s) thereof. For example, the graph 300 can represent a time delay that can be applied to a clock signal as a function of a configuration of at least one of the MMD 200 or the DCDL 202 of FIG. 2. The x-axis 302 of the graph 300 (identified by Digital Control Codes) represents a plurality of digital codes (e.g., digital control codes) in an example range of 0 to 2048. The y-axis 304 of the graph 300 (identified by time delay ($T_D$)) represents time delays in example ranges of 0 to $T_{VCO}$ and $T_{VCO}$ to $2T_{VCO}$ (e.g., $2*T_{VCO}$).

In the illustrated example, the DCDL 202 can be configured such that a first digital code (e.g., a digital code of 0) can produce a negligible or zero time delay and a second digital code (e.g., a digital code of 1024) can produce a time delay of $T_{VCO}$. For example, the DCDL 202 can be configured to apply a time delay to a clock signal in a first time delay range 306 of 0 (or a different value) up to at least $T_{VCO}$. The first time delay range is identified in FIG. 3 by REGION I.

In the illustrated example, the time delay range of 0 to $T_{VCO}$ can be extended up to at least $2T_{VCO}$. For example, if a time delay that is to be applied to a clock signal is greater than $T_{VCO}$, configurations of the DCDL 202 and the MMD 200 can be adjusted, changed, and/or modified to extend the time delay range. For example, the digital control of the DCDL 202 can be reset such that the DCDL digital code 218 of FIG. 2 can be reset to a digital code of 0 and the digital control of the MMD 200 can be changed to increase the count threshold of the MMD 200. For example, the control circuitry 122 can change the divider digital code 214 from 8 to 16 to change the count threshold of the pulse swallow divider 212 from 8 to 16. In this example, the change from 8 to 16 can change the baseline time delay from 0 to $T_{VCO}$ to 0 to $2T_{VCO}$ and thereby shift the time delay range from the first time delay range 306 to a second time delay range 308 (identified by REGION II), which ranges from $T_{VCO}$ up to at least $2T_{VCO}$. Beneficially, configurations of at least one of the DCDL 202 or the MMD 200 can be changed as described above to increase the time delay range by increments of at least $T_{VCO}$ (e.g., increase from $2T_{VCO}$ to $3T_{VCO}$, from $3T_{VCO}$ to $4T_{VCO}$, etc.).

Figure 4:
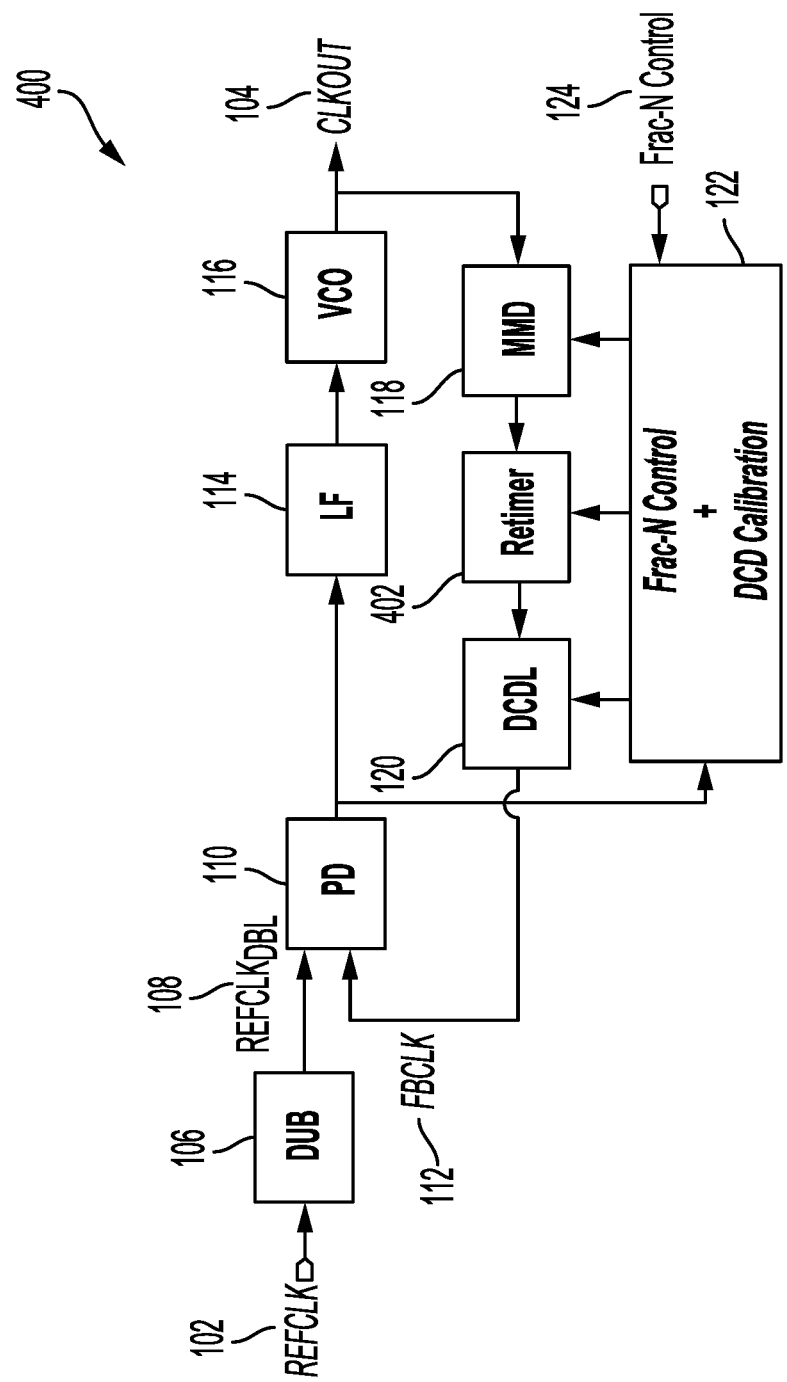
FIG. 4 depicts a schematic illustration of another example phase-locked loop including a multi-modulus divider, a retimer, and a digitally controlled delay line to reduce duty cycle distortion of the phase-locked loop.

FIG. 4 depicts a schematic illustration of another example PLL 400. The PLL 400 of this example includes the reference clock signal 102, the output clock signal 104, the frequency doubler 106, the doubled reference clock signal 108, the PD 110, the feedback clock signal 112, the LF 114, the VCO 116, the MMD 118, the DCDL 120, the control circuitry 122, and the control signal(s) 124 of FIG. 1.

The PLL 400 of the illustrated example includes a retimer 402 that can be configured to delay the divided clock signal from the MMD 118. In some embodiments, the retimer 402 is a retimer circuit that can be configured to delay the divided clock signal by a time delay in a time delay range up to at least a period of the VCO 116 (e.g., $T_{VCO}$). In this example, an output of the MMD 118 is coupled to an input (e.g., a retimer input) of the retimer 402. In this example, an output (e.g., a retimer output) of the retimer 402 is coupled to an input of the DCDL 120. In some embodiments, the MMD 118 is coupled to the DCDL 120 through the retimer 402. Although only retimer 402 is depicted in FIG. 4, one or more additional retimers (e.g., retimer stages) and/or types of retimers may be utilized in the PLL 400.

Beneficially, the time delay introduced by the retimer 402 can achieve a reduction (e.g., a further reduction) in the duty cycle distortion of the PLL 400 in combination with at least one of the MMD 118 or the DCDL 120. For example, the MMD 118 can be configured to provide a first time delay up to at least $T_{VCO}$, the retimer 402 can be configured to provide a second time delay up to at least $T_{VCO}$, and/or the DCDL 120 can be configured to provide a third time delay up to at least $T_{VCO}$. In some embodiments, the total time delay that can be applied to the output clock signal 104 is based on a combination of at least one of the first time delay, the second time delay, or the third time delay. For example, the total time delay that can be applied to the output clock signal 104 can be $3T_{VCO}$ (e.g., $3*T_{VCO}$). Beneficially, at least one of the MMD 118, the retimer 402, or the DCDL 120 can be configured (e.g., reconfigured) to extend and/or otherwise increase the total time delay that can be achieved, such as by increasing the time delay range of 0 to $3T_{VCO}$ to 0 to $4T_{VCO}$, 0 to $5T_{VCO}$, etc.

While an example implementation of the PLL 400 is depicted in FIG. 4, other implementations are contemplated. For example, one or more blocks, components, functions, etc., of the PLL 400 may be combined or divided in any other way. The PLL 400 of the illustrated example may be implemented by hardware alone, or by a combination of hardware, software, and/or firmware. For example, the PLL 400 may be implemented by one or more analog or digital circuits (e.g., comparators, operational amplifiers, etc.), one or more hardware-implemented state machines, one or more programmable processors, one or more ASICs, etc., and/or any combination(s) thereof. The PLL 400 of the illustrated example can be implemented by one or more ICs on the same die or two or more different dies.

Figure 5:
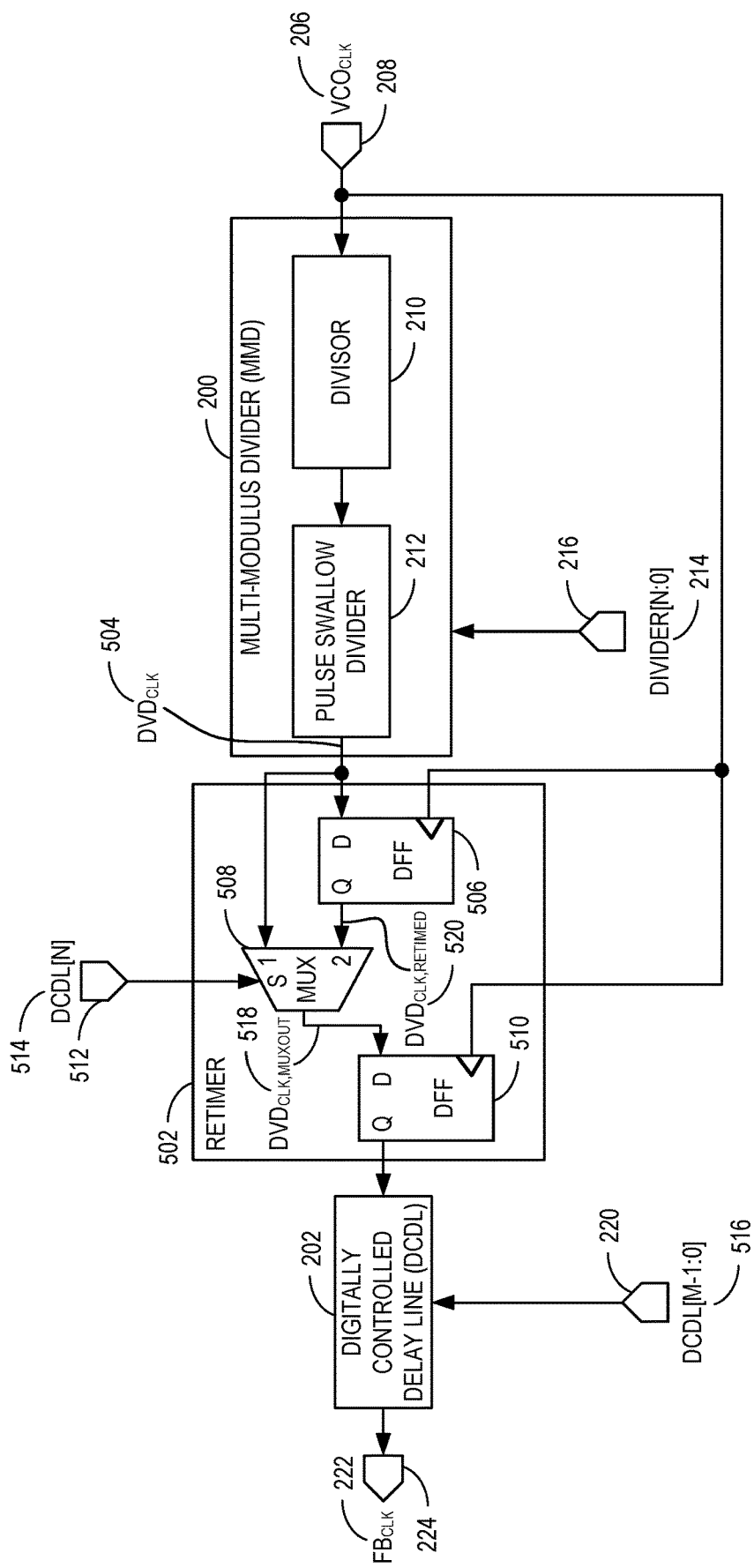
FIG. 5 depicts a schematic illustration of example implementations of the multi-modulus divider, the retimer, and the digitally controlled delay line of FIGS. 1 and/or 4.

FIG. 5 depicts a schematic illustration of example implementations of the MMD 200, a retimer 502, and the DCDL 202 of FIGS. 2 and/or 4. For example, the MMD 200 can correspond to and/or implement the MMD 118 of FIGS. 1 and/or 4. In some embodiments, the DCDL 202 can correspond to and/or implement the DCDL 120 of FIGS. 1 and/or 4. In some embodiments, the retimer 502 can correspond to and/or implement the retimer 402 of FIG. 4.

The MMD 200 of the illustrated example includes the divisor 210 and the pulse swallow divider 212 of FIG. 2. Further depicted in FIG. 5 are the clock signal 206 and the first I/O port 208 of FIG. 2. In this example, the pulse swallow divider 212, and/or, more generally, the MMD 200, can be configured by the divider digital code 214 of FIG. 2, which is received via the second I/O port 216.

In some embodiments, the pulse swallow divider 212 can delay the divided clock signal from the divisor 210 by a time delay in a time delay range, which can correspond to the divider digital code 214, to generate and/or output a delayed clock signal 504 (identified by $DVD_{CLK}$). For example, the delayed clock signal 504 can be a delayed version of the divided clock signal from the divisor 210.

The retimer 502 of the illustrated example can be configured to delay the delayed clock signal 504 by a time delay. The retimer 502 of this example includes a first flip-flop 506 (e.g., a first flip-flop circuit), a multiplexer 508 (e.g., a multiplexer circuit), and a second flip-flop 510 (e.g., a second flip-flop circuit). The first and second flip-flops 506, 510 of this example are D flop-flops. Alternatively, the first flip-flop 506 and/or the second flip-flop 510 may be a different type of a flip-flop or latch. Non-limiting examples of flip-flops include SR flip-flops, JK flip-flops, and T flip-flops.

In the illustrated example, a first input (e.g., a D input, a flip-flop input) of the first flip-flop 506 is coupled to an output of the pulse swallow divider 212. An output (e.g., a Q output, a flip-flop output) of the first flip-flop 506 is coupled to a second input (identified by 2) (e.g., a second multiplexer input) of the multiplexer 508. A clock input of the first flip-flop 506 is coupled to the first I/O port 208 such that the clock input can receive the clock signal 206.

In the illustrated example, a first input (identified by 1) (e.g., a first multiplexer input) of the multiplexer 508 is coupled to the output of the pulse swallow divider 212. A select input (identified by S) of the multiplexer 508 is coupled to a fourth I/O port 512 such that the select input can be configured to receive DCDL digital code 514 (identified by DCDL[N]). In the illustrated example, the DCDL digital code 514 is a 1-bit digital code that is part of DCDL digital code 516. For example, the DCDL digital code 516, which can be provided to the DCDL 202 via the third I/O port 220, can be an M-bit digital code of which M−1 bits are provided to the DCDL 202 and the Mth bit is provided to the multiplexer 508 via the fourth I/O port 512.

In this example, an output (e.g., a multiplexer output) of the multiplexer 508 is coupled to a first input (e.g., a D input, a flip-flop input) of the second flip-flop 510. In the illustrated example, an output (e.g., a Q output, a flip-flop output) of the second flip-flop 510 is coupled to an input of the DCDL 202. A clock input of the second flip-flop 510 is coupled to the first I/O port 208 such that the clock input can receive the clock signal 206.

In some embodiments, the retimer 502 can be configured to delay the delayed clock signal 504 by $T_{VCO}$ according to a mode of operation. For example, in a first mode of operation, the retimer 502 can be bypassed. For example, the DCDL digital code 514 can have a bit value of 0 (e.g., a logic low bit value) that controls the multiplexer 508 to select the first input for output as a muxed signal 518 (identified by $DVD_{CLK,MUXOUT}$). In some such embodiments, the multiplexer 508 can output the delayed clock signal 504 to the second flip-flop 510 which, in turn, can output the delayed clock signal 504 to the DCDL 202. For example, in the first mode of operation, the retimer 502 may not delay the delayed clock signal 504.

In a second mode of operation, the delayed clock signal 504 can be routed and/or passed through the retimer 502 such that the delayed clock signal 504 can be delayed. For example, the DCDL digital code 514 can have a bit value of 1 (e.g., a logic high bit value) that controls the multiplexer 508 to select the second input for output. In some such embodiments, the multiplexer 508 can output the output of the first flip-flop 506, which is a retimed clock signal 520 (identified by $DVD_{CLK,RETIMED}$). For example, the first flip-flop 506 can cause a delay of the delayed clock signal 504 by delaying the output of the delayed clock signal 504 by one clock cycle. In some such embodiments, in the second mode of operation, the retimer 502 can delay the delayed clock signal 504 by $T_{VCO}$.

Beneficially, the time delay introduced by the retimer 502 can achieve a reduction (e.g., a further reduction) in the duty cycle distortion of the PLL 400 of FIG. 4 in combination with at least one of the MMD 200 or the DCDL 202. For example, the MMD 200 can be configured to provide a first time delay up to at least $T_{VCO}$, the retimer 502 can be configured to provide a second time delay up to at least $T_{VCO}$, and/or the DCDL 202 can be configured to provide a third time delay up to at least $T_{VCO}$. In some embodiments, the total time delay that can be applied to the clock signal 206 is based on a combination of at least one of the first time delay, the second time delay, or the third time delay. For example, the total time delay that can be applied to the clock signal 206 can be $3T_{VCO}$. Beneficially, at least one of the MMD 200, the retimer 502, or the DCDL 202 can be configured (e.g., reconfigured) to extend and/or otherwise increase the total time delay that can be achieved, such as by increasing the time delay range of 0 to $3T_{VCO}$ to 0 to $4T_{VCO}$, 0 to $5T_{VCO}$, etc.

Figure 6:
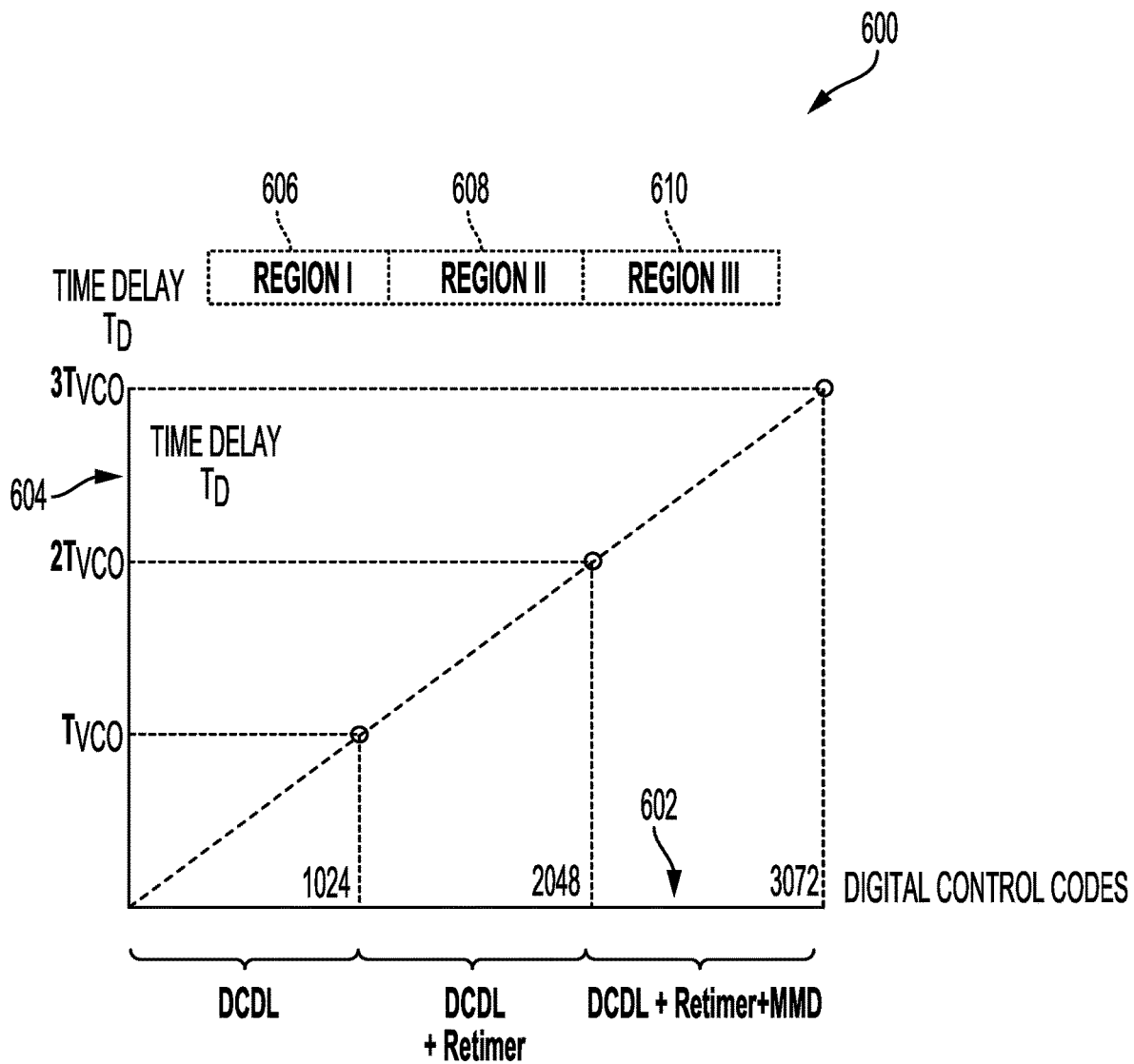
FIG. 6 is a graph of example time delays in time delay ranges that may be achieved by the phase-locked loop of FIG. 4.

FIG. 6 is a graph 600 of example time delays in time delay ranges that may be achieved by a PLL, such as the PLL 400 of FIG. 4, or portion(s) thereof. For example, the graph 600 can represent a time delay that can be applied to a clock signal as a function of a configuration of at least one of the MMD 200 or the DCDL 202 of FIGS. 2 and/or 5. The x-axis 602 of the graph 600 (identified by Digital Control Codes) represents a plurality of digital codes (e.g., digital control codes) in an example range of 0 to 3072. The y-axis 604 of the graph 600 (identified by time delay ($T_D$)) represents time delays in example ranges of 0 to $T_{VCO}$, $T_{VCO}$ to $2T_{VCO}$, and $2T_{VCO}$ to $3T_{VCO}$.

In the illustrated example, the DCDL 202 can be configured such that a first digital code (e.g., a digital code of 0) can produce a negligible or zero time delay and a second digital code (e.g., a digital code of 1024) can produce a time delay of $T_{VCO}$. For example, the DCDL 202 can be configured to apply a time delay to a clock signal in a first time delay range 606 of 0 (or a different value) up to at least $T_{VCO}$. The first time delay range is identified in FIG. 6 by REGION I.

In the illustrated example, the time delay range of 0 to $T_{VCO}$ can be extended up to at least $2T_{VCO}$. For example, if a time delay that is to be applied to a clock signal is greater than $T_{VCO}$, configurations of the DCDL 202, the retimer 502, and/or the MMD 200 can be adjusted, changed, and/or modified to extend the time delay range. For example, the digital control of the DCDL 202 can be reset such that the DCDL digital code 516 of FIG. 5 can be reset to a digital code of 0 and the DCDL digital code 514 of FIG. 5 can be changed (e.g., from a logic low bit value to a logic high bit value or vice versa) to delay the delayed clock signal 504. For example, the control circuitry 122 can change the DCDL digital code 514 such that the retimer 502 is not bypassed. In this example, the change from bypassing the retimer 502 to not bypassing the retimer 502 can change the baseline time delay from 0 to $T_{VCO}$ to 0 to $2T_{VCO}$ and thereby shift the time delay range from the first time delay range 606 to a second time delay range 608 (identified by REGION II), which ranges from $T_{VCO}$ up to at least $2T_{VCO}$.

In the illustrated example, the time delay range of 0 to $2T_{VCO}$ can be extended up to at least $3T_{VCO}$. For example, if a time delay that is to be applied to a clock signal is greater than $2T_{VCO}$, configurations of the DCDL 202, the retimer 502, and/or the MMD 200 can be adjusted, changed, and/or modified to extend the time delay range. For example, the digital control of the DCDL 202 can be reset such that the DCDL digital code 516 of FIG. 5 can be reset to a digital code of 0, the DCDL digital code 514 can be set to not bypass the retimer 502, and the digital control of the MMD 200 can be changed to increase the count threshold of the MMD 200. For example, the control circuitry 122 can change the divider digital code 214 from 8 to 16 to change the count threshold of the pulse swallow divider 212 from 8 to 16. In this example, the change from 8 to 16 can change the baseline time delay from 0 to $2T_{VCO}$ and thereby shift the time delay range from the second time delay range 608 to a third time delay range 610 (identified by REGION III), which ranges from $2T_{VCO}$ up to at least $3T_{VCO}$. Beneficially, configurations of at least one of the DCDL 202 or the MMD 200 can be changed as described above to increase the time delay range by increments of at least $T_{VCO}$ (e.g., increase from $2T_{VCO}$ to $3T_{VCO}$, from $3T_{VCO}$ to $4T_{VCO}$, etc.).

Figure 7:
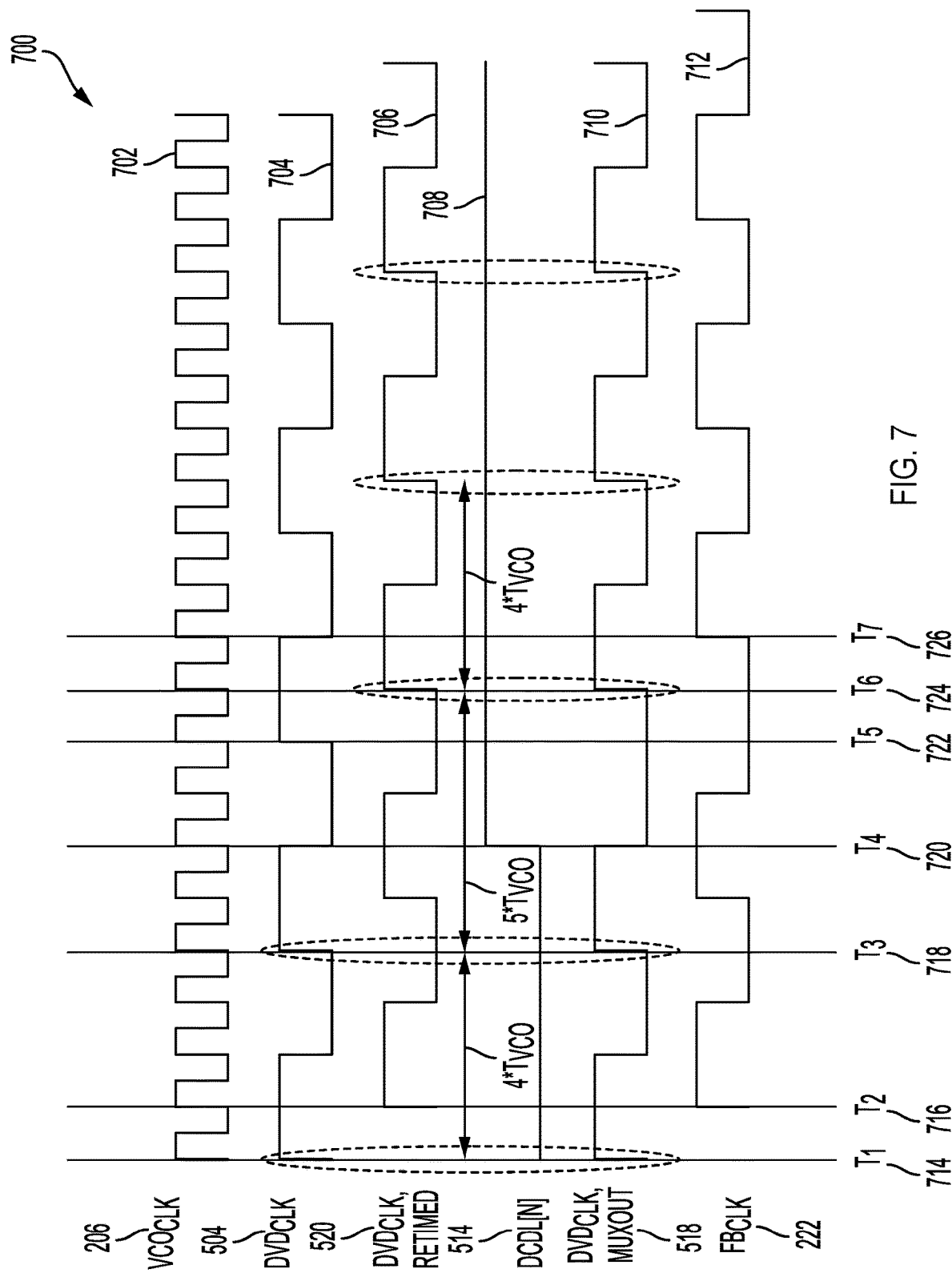
FIG. 7 depicts a timing diagram representative of example operation of the multi-modulus divider, the retimer, and the digitally controlled delay line of FIGS. 4 and/or 5.

FIG. 7 depicts a timing diagram 700 representative of example operation of the multi-modulus divider 118, the retimer 402, and the DCDL 120 of FIG. 4. For example, the timing diagram 700 can be representative of example operation of the MMD 200, the retimer 502, and/or the DCDL 202 of FIG. 5. In some embodiments, the timing diagram 700 represents a first time delay that can be applied to a clock signal by the MMD 200, a second time delay that can be applied to the clock signal by the retimer 502, and/or a third time delay that can be applied to the clock signal by the DCDL 202.

The timing diagram 700 of the illustrated example includes a first waveform 702, a second waveform 704, a third waveform 706, a fourth waveform 708, a fifth waveform 710, and a sixth waveform 712.

The first waveform 702 can be an example waveform of the clock signal 206 of FIGS. 2 and/or 5. The second waveform 704 can be an example waveform of the delayed clock signal 504 of FIG. 5. The third waveform 706 can be an example waveform of the retimed clock signal 520 of FIG. 5. The fourth waveform 708 can be an example waveform of the DCDL digital code 514 of FIG. 5. The fifth waveform 710 can be an example waveform of the muxed signal 518 of FIG. 5. The sixth waveform 712 can be an example waveform of the feedback clock signal 222 of FIGS. 2 and/or 5.

At a first time 714 (identified by $T_1$) of the timing diagram 700, a rising edge of the delayed clock signal 504 is asserted. Because the DCDL digital code 514 is not asserted, the retimer 502 of FIG. 5 is bypassed and causes the muxed signal 518 to output the delayed clock signal 504 without a substantive delay. At a second time 716 (identified by $T_2$), a rising edge of the feedback clock signal 222 is asserted. For example, the DCDL 202 can delay the muxed signal 518 by $T_{VCO}$.

At a third time 718 (identified by $T_3$) of the timing diagram 700, the rising edge of the delayed clock signal 504 is asserted after 4 VCO clocks ($4T_{VCO}$). For example, the MMD 200 can delay a rising edge of the delayed clock signal 504 from being asserted by a time period of $4T_{VCO}$.

At a fourth time 720 (identified by $T_4$), a rising edge of the DCDL digital code 514 is asserted, which controls operation of the retimer 502 such that the retimer 502 is not bypassed. For example, the control circuitry 122 of FIGS. 1 and/or 4 can determine that, based on the error signal of the PD 110 of FIGS. 1 and/or 4, additional delay of the feedback clock signal 112 is needed. In response to the determination, the control circuitry 122 can cause the retimer 502 to add the additional delay by causing the multiplexer 508 to select the input corresponding to the output of the first flip-flop 506.

At a fifth time 722 (identified by $T_5$), the delayed clock signal 504 is asserted after the divisor 210 divides the clock signal 206 by a divisor and the pulse swallow divider 212 swallows a number of pulses of the clock signal 206.

At a sixth time 724 (identified by $T_6$), the muxed signal 518 is asserted after a delay of $T_{VCO}$ because the retimer 502 is not bypassed. For example, the first flip-flop 506 delays the delayed clock signal 504 from being provided to the multiplexer 508 by a time period of $T_{VCO}$. In the illustrated example, the time difference between the delayed clock signal 504 being asserted at the third time 718 and the muxed signal 518 being asserted at the sixth time 724 corresponds to a delay of $5T_{VCO}$ (instead of $4T_{VCO}$ in this example) because of the delay of $T_{VCO}$ introduced by the retimer 502. At a seventh time 726 (identified by $T_7$), the feedback clock signal 222 is asserted. For example, the muxed time signal 518 is delayed by the DCDL 202 by a time delay of $T_{VCO}$.

Figure 8:
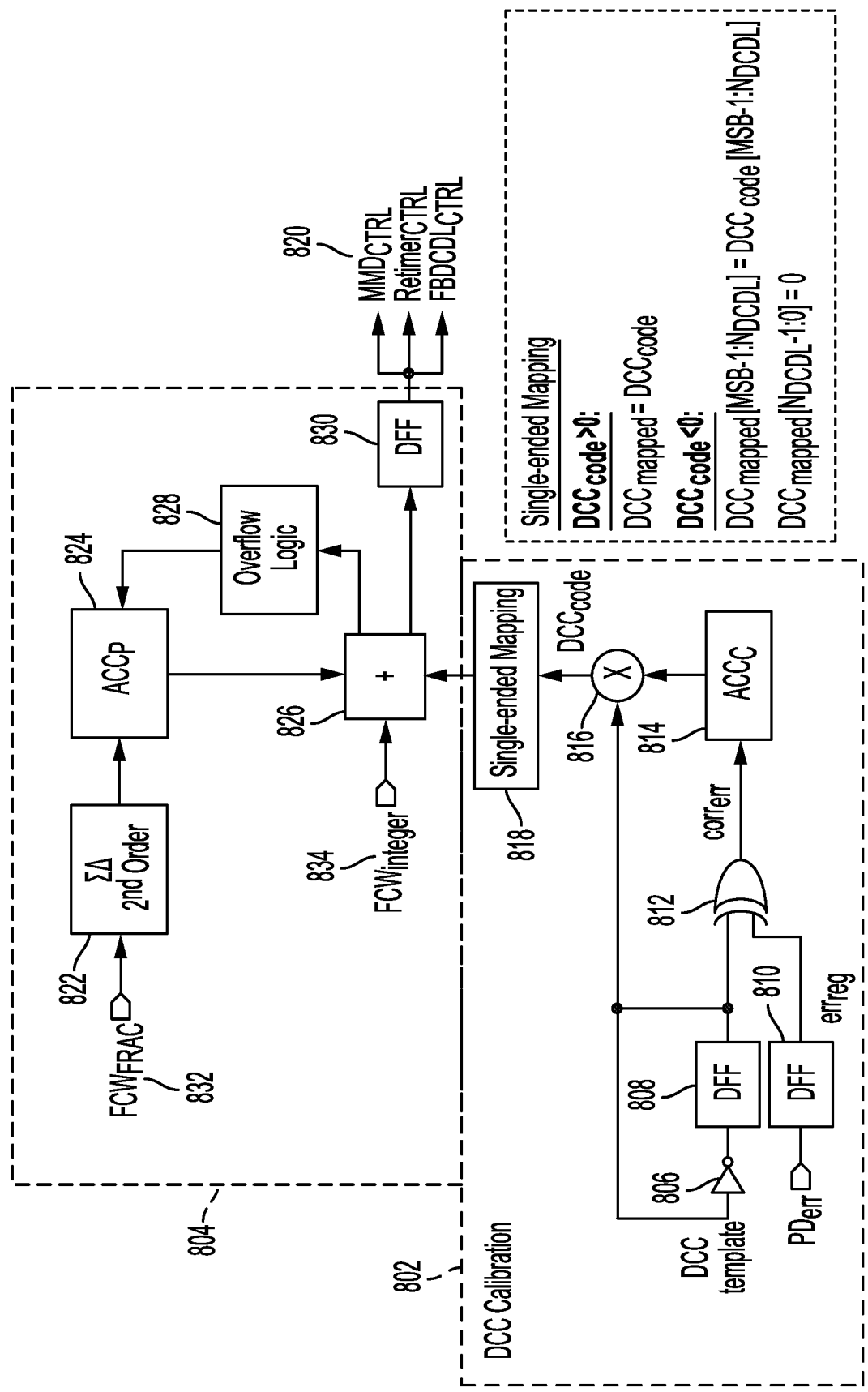
FIG. 8 depicts example implementations of a single-ended mapping duty cycle correction circuit and a fractional-N divider circuit.

FIG. 8 depicts example implementations of a single-ended mapping duty cycle correction circuit (DCC) 802 and a fractional-N divider (Frac-N divider) circuit 804. In some embodiments, the DCC circuit 802 can correspond to and/or implement at least a portion of the control circuitry 122 of FIGS. 1 and/or 4. In some embodiments, the Frac-N divider circuit 804 can correspond to and/or implement at least a portion of the control circuitry 122.

In some embodiments, the DCC circuit 802 implements DCC calibration by using a +1, −1 template to detect digitally controlled delay (DCD) error at the PD output. For example, the DCC circuit 802 can use least-mean squared (LMS) background calibration to minimize the error correlated to the DCD template. In some embodiments, the DCD circuit 802 can translate an error signal generated by a PD, such as the PD 110 of FIGS. 1 and/or 4, into a control signal, such as a digital code. The DCC circuit 802 of the illustrated example can implement single-ended mapping because the DCDL 120 of FIGS. 1 and/or 4 is included in the feedback path of the PLL 100 of FIG. 1 and/or the PLL 400 of FIG. 4.

The DCC circuit 802 includes an inverter 806, delay flip-flops 808, 810, a logic gate 812, an accumulator 814, a multiplier 816, and single-ended mapping logic 818. The inverter 806 inverts the DCC template and a first delay flip-flop 808 of the delay flip-flops 808, 810 outputs the inverted DCC template to the logic gate 812. The logic gate 812 of this example is an XOR gate, but any other logic gate and/or combination of logic gates may be used. The XOR gate can output a signal based on a comparison of the inverted DCC template (e.g., a signal representing a logic −1 or a logic +1) and an error signal (identified by $err_{reg}$) based on the error signal from the PD 110 of FIGS. 1 and/or 4 (identified by $PD_{err}$). The accumulator 814 can accumulate the values of the output signal of the logic gate 812 (identified by $corr_{err}$). The multiplier 816 can multiply the non-inverted DCC template and the output of the accumulator to generate a digital code (identified by $DCC_{code}$).

In some embodiments, the single-ended mapping logic 818 can map the digital code (identified by $DCC_{code}$) to an output digital code (identified by $DCC_{mapped}$). For example, the single-ended mapping logic 818 can output the digital code as the output digital code after a determination that the digital code represents a positive value. In some embodiments, the single-ended mapping logic 818 can output a portion of the digital code as the output digital code after a determination that the digital code represents a negative value.

In some embodiments, the Frac-N divider circuit 804 generates control signals 820 to control at least one of the MMD 118 of FIGS. 1 and/or 4, the retimer 402 of FIG. 4, or the DCDL 120 of FIGS. 1 and/or 4. For example, the Frac-N divider circuit 804 can generate $MMD_{CTRL}$ to control (e.g., change a configuration of) the MMD 118. In some embodiments, the Frac-N divider circuit 804 can generate $Retimer_{CTRL}$ to control the retimer 402. In some embodiments, the Frac-N divider circuit 804 can generate $FBDCDL_{CTRL}$ to control the DCDL 120.

The Frac-N divider circuit 804 includes a second-order sigma-delta modulator 822, an accumulator 824, an adder 826, overflow logic 828, and a delay flip-flop 830. The second-order sigma-delta modulator 822 can receive a first digital code 832 (identified by $FCW_{FRAC}$), which can be at least part of a digital word. For example, the first digital code 832 can correspond to and/or implement at least part of the control signal(s) 124 of FIGS. 1 and/or 4. In this example, the first digital code 832 represents a fraction of an integer of which a signal is to be divided. By way of example, if the MMD 118 is to delay the clock signal 104 by 4.25, then the first digital code 832 can represent 0.25.

In some embodiments, the second-order sigma-delta modulator 822 can output a bit value corresponding to the first digital code 832. The accumulator 824 can accumulate the outputs from the second-order sigma-delta modulator 822. The adder 826 can add and/or otherwise combine the output from the accumulator 824 and a value that corresponds to the second digital code 834. For example, the second digital code 834 can correspond to and/or implement at least part of the control signal(s) 124 of FIGS. 1 and/or 4. In this example, the second digital code 834 represents an integer of which a signal is to be divided. By way of example, if the MMD 118 is to delay the clock signal 104 by 4.25, then the second digital code 834 can represent 4. The adder 826 can output the sum and/or otherwise the combination of the accumulator output and the value corresponding to the second digital code 834 to the delay flip-flop 830. The delay flip-flop 830 can output the control signals 820 to at least one of the MMD 118, the retimer 402, or the DCDL 120 to effectuate respective time delays that is/are to be applied to the clock signal 104.

Figure 9:
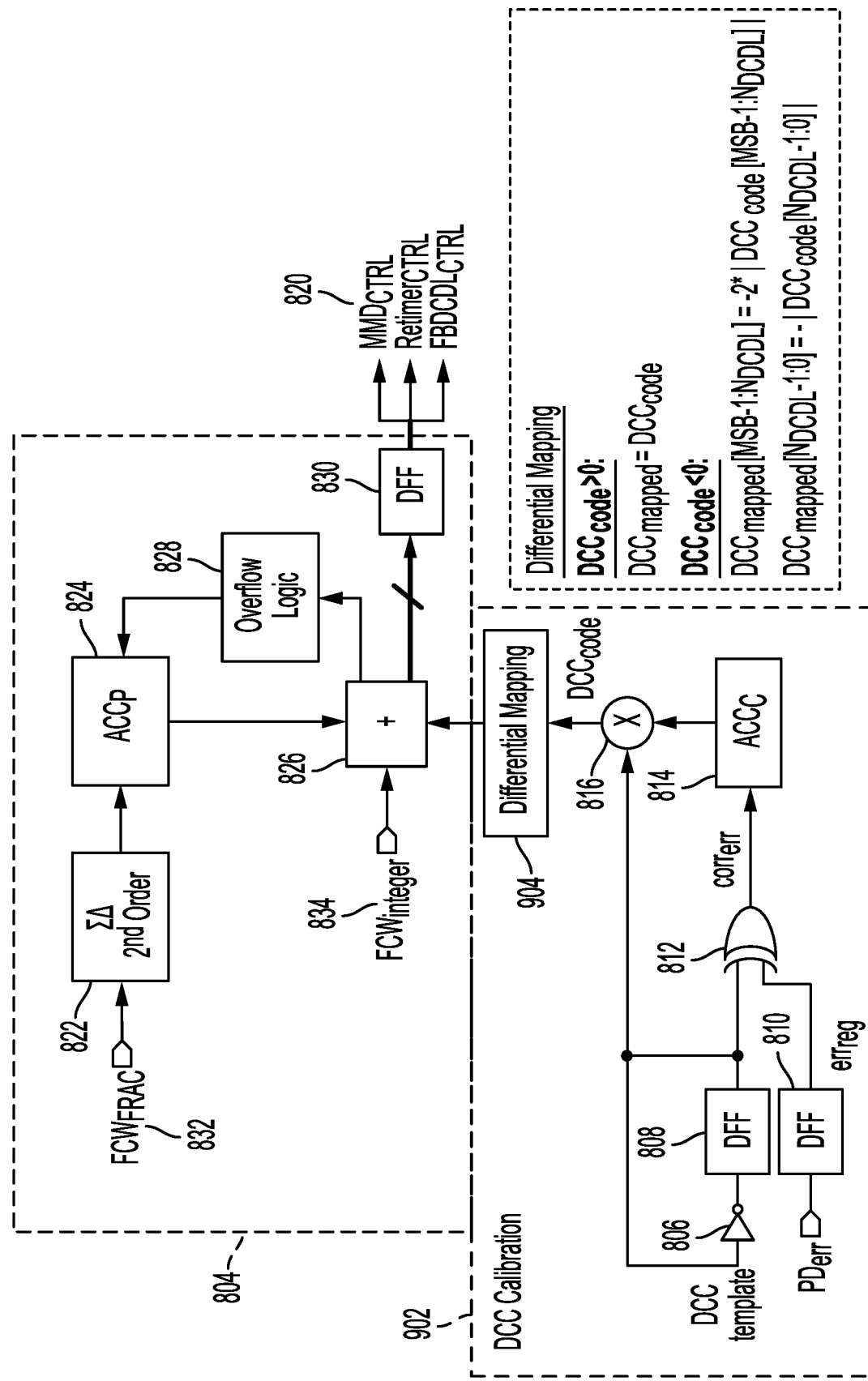
FIG. 9 depicts example implementations of a differential mapping duty cycle correction circuit and the fractional-N divider circuit of FIG. 8.

FIG. 9 depicts example implementations of a differential mapping duty cycle correction circuit (DCC) 902 and the Frac-N divider circuit 804 of FIG. 8. In some embodiments, the DCC circuit 902 can correspond to and/or implement at least a portion of the control circuitry 122 of FIGS. 1 and/or 4. In some embodiments, the Frac-N divider circuit 804 can correspond to and/or implement at least a portion of the control circuitry 122.

In some embodiments, the DCC circuit 902 implements DCC calibration by using a +1, −1 template to detect DCD error at the PD output. For example, the DCC circuit 902 can use LMS background calibration to minimize the error correlated to the DCD template. The DCC circuit 902 of the illustrated example can implement differential mapping if a first portion of the DCDL 120 of FIGS. 1 and/or 4 is included in the reference path (e.g., along a path that includes the frequency doubler 106, the PD 110, the LF 114, and/or the VCO 116) of the PLL 100 of FIG. 1 and/or the PLL 400 of FIG. 4 and a second portion of the DCDL 120 is included in the feedback path (e.g., a path that includes the MMD 118, the DCDL 120, and/or the PD 110) of the PLL 100 of FIG. 1 and/or the PLL 400 of FIG. 4.

The differential mapping logic 904 can map the digital code (identified by $DCC_{code}$) to an output digital code (identified by $DCC_{mapped}$). For example, the differential mapping logic 904 can output the digital code as the output digital code after a determination that the digital code represents a positive value. In some embodiments, the differential mapping logic 904 can output an adjustment of the digital code as the output digital code after a determination that the digital code represents a negative value.

Figure 10:
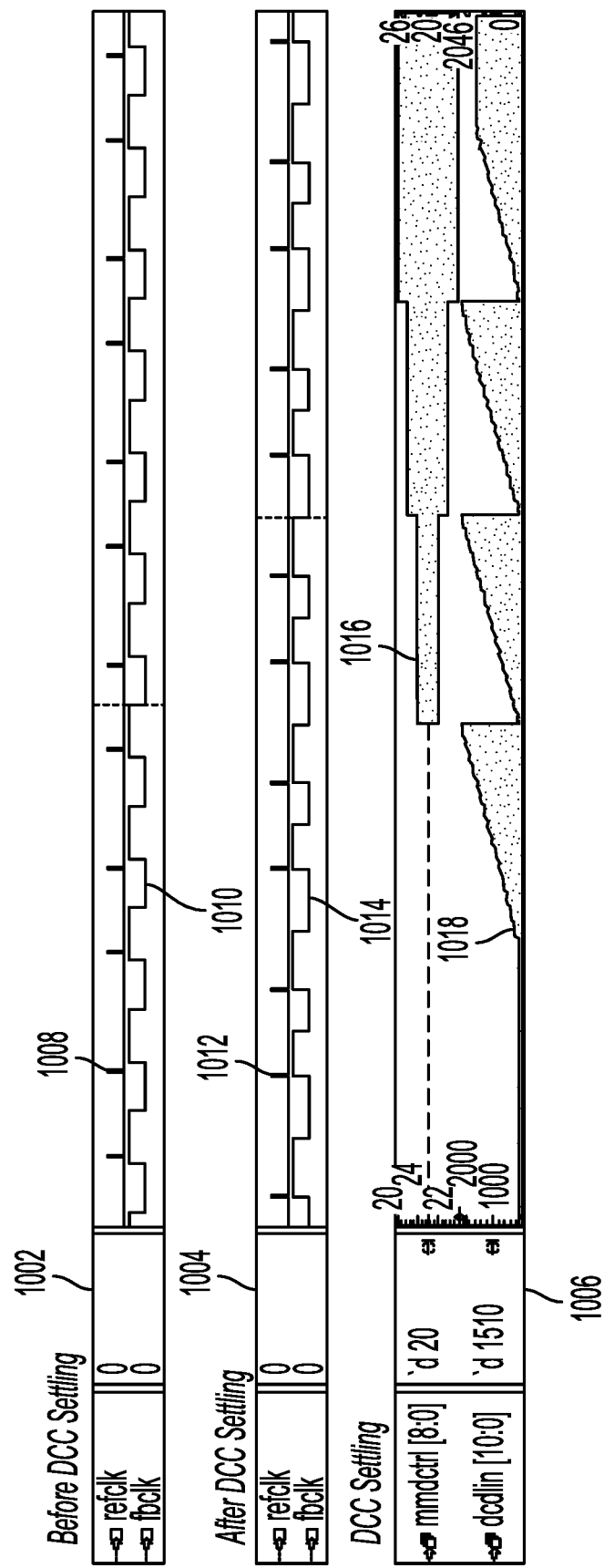
FIG. 10 depicts example timing diagrams representative of example operation of the phase-locked loop of FIGS. 1 and/or 4 using the single-ended mapping and/or the differential mapping duty cycle correction circuit of FIGS. 8 and/or 9.

FIG. 10 depicts example timing diagrams 1002, 1004, 1006 representative of example operation of the PLL 100 of FIG. 1 and/or the PLL 400 of FIG. 4. In some embodiments, the timing diagrams 1002, 1004, 1006 represent example operation of the PLL 100 and/or the PLL 400 using the DCC circuit 802 of FIG. 8 and/or the DCC circuit of FIG. 9. For example, the timing diagrams 1002, 1004, 1006 can represent example locking of the phases of a reference clock signal and a feedback clock signal to reduce duty cycle distortion.

A first timing diagram 1002 of the timing diagrams 1002, 1004, 1006 can represent the effects of duty cycle distortion on the inability to lock phases of a reference clock signal and a feedback clock signal. For example, the first timing diagram 1002 can represent a first waveform 1008 corresponding to a reference clock signal, such as the reference clock signal 102 of FIGS. 1 and/or 4. The first timing diagram 1002 can represent a second waveform 1010 corresponding to a feedback clock signal, such as the feedback clock signal 112 of FIGS. 1 and/or 4. In the first timing diagram 1002, prior to settling of the DCC circuit 802 of FIG. 8 and/or the DCC circuit 902 of FIG. 9, the phases of the reference clock signal 102 and the feedback clock signal 112 are unable to lock.

A second timing diagram 1004 of the timing diagrams 1002, 1004, 1006 can represent the mitigation of the effects of duty cycle distortion due to settling of the DCC circuit 802 of FIG. 8 and/or the DCC circuit of FIG. 9. For example, the second timing diagram 1004 can represent a third waveform 1012 corresponding to a reference clock signal, such as the reference clock signal 102 of FIGS. 1 and/or 4. The second timing diagram 1004 can represent a fourth waveform 1014 corresponding to a feedback clock signal, such as the feedback clock signal 112 of FIGS. 1 and/or 4. In the second timing diagram 1004, after settling of the DCC circuit 802 of FIG. 8 and/or the DCC circuit 902 of FIG. 9, the phases of the reference clock signal 102 and the feedback clock signal 112 are able to lock.

A third timing diagram 1006 of the timing diagrams 1002, 1004, 1006 can represent the settling of the DCC circuit 802 of FIG. 8 and/or the DCC circuit 902 of FIG. 9. For example, the third timing diagram 1006 can represent a fifth waveform 1016 of a digital code to control the MMD 118, such as the divider digital code 214 of FIGS. 2 and/or 5. The fifth waveform 1016 depicts a ramping up of the divider digital code 214 from 23 to 24 to 25 to 26, etc., to iteratively increase the time delay that the MMD 118 applies to the output clock signal 104. The third timing diagram 1006 can represent a sixth waveform 1018 of a digital code to control the DCDL 120, such as the DCDL digital code 218 of FIG. 2 and/or the DCDL digital code 516 of FIG. 5. The sixth waveform 1018 depicts a ramping up of the DCDL digital code 218 and/or the DCDL digital code 516 from 0 to 2048 to iteratively increase the time delay that the DCDL 120 applies to the output from the MMD 118.

Figure 11:
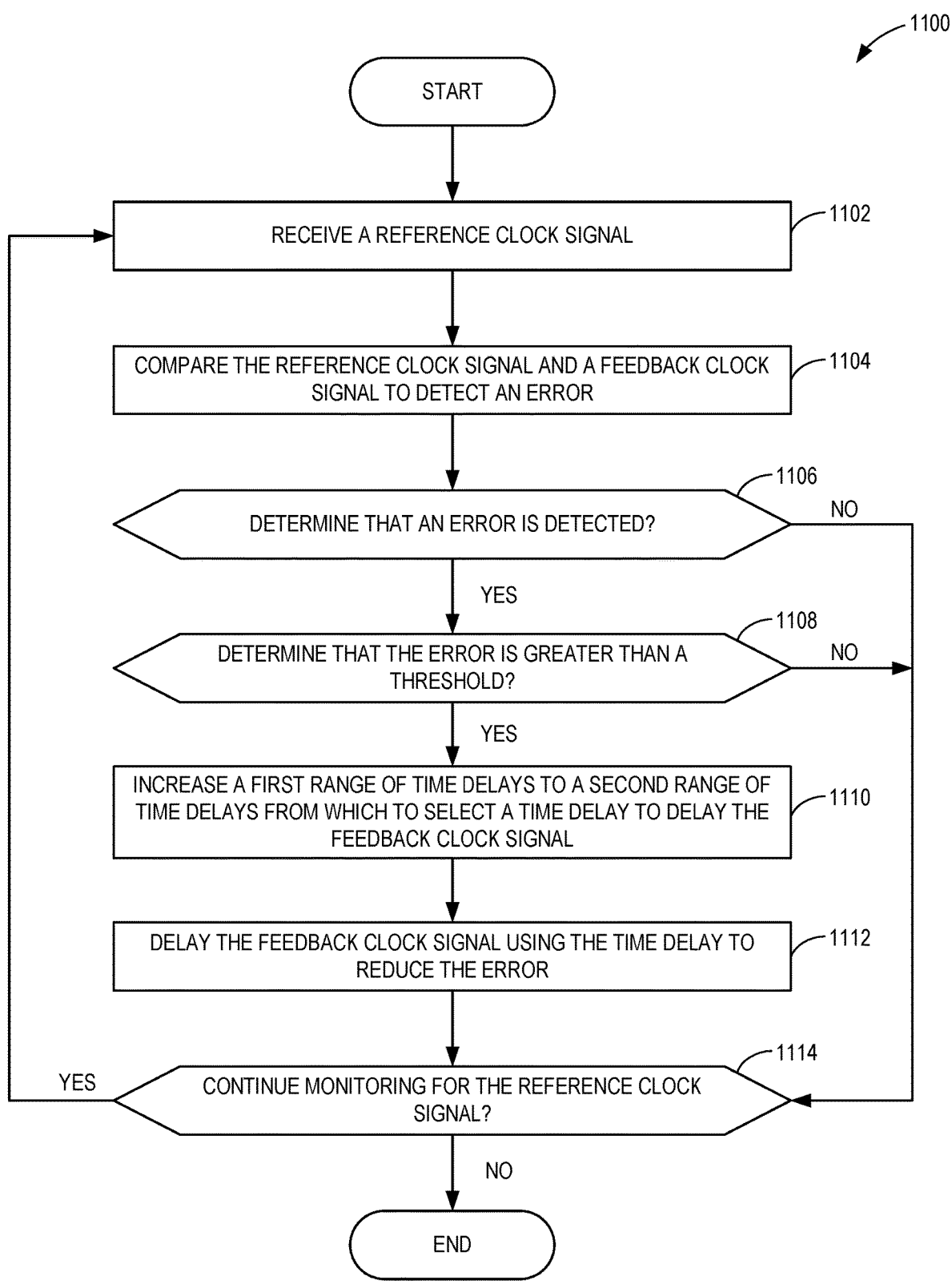
FIG. 11 is a flowchart representative of an example process that may be performed and/or implemented using hardware logic or machine-readable instructions that may be

FIG. 11 is a flowchart 1100 representative of an example process that may be performed and/or implemented using hardware logic or machine-readable instructions that may be executed by processor circuitry to implement the PLL 100 of FIG. 1 and/or the PLL 400 of FIG. 4. The flowchart 1100 of FIG. 11 begins at block 1102, at which the PLL 100 and/or the PLL 400 receive a reference clock signal. For example, the frequency doubler 106 of FIGS. 1 and/or 4 can receive the reference clock signal 102 and generate the doubled reference clock signal 108 according to a doubling of the reference clock signal 102. The PD 110 of FIGS. 1 and/or 4 can receive the doubled reference clock signal 108 from the frequency doubler 106.

At block 1104, the PLL 100 and/or the PLL 400 compare the reference clock signal and a feedback clock signal to detect an error. For example, the PD 110 can compare the doubled reference clock signal 108 and the feedback clock signal 112 to detect an error based on the comparison.

At block 1106, the PLL 100 and/or the PLL 400 determine whether an error is detected. For example, the PD 110 can output a first signal representative of a +1 in response to a determination that a first phase of the doubled reference clock signal 108 is greater than a second phase of the feedback clock signal 112. In some embodiments, the PD 110 can output a second signal representative of a −1 in response to a determination that the first phase of the doubled reference clock signal 108 is less than the second phase of the feedback clock signal 112. If, at block 1106, the PLL 100 and/or the PLL 400 determine(s) that an error is not detected, control proceeds to block 1114. Otherwise, control proceeds to block 1108.

At block 1108, the PLL 100 and/or the PLL 400 determine whether the error is greater than a threshold. For example, the control circuitry 122 can determine, based on the error signal from the PD 110, that the time delay that can be applied by at least one of the MMD 118 or the DCDL 120 is less than a time delay needed to correct the error. If, at block 1108, the PLL 100 and/or the PLL 400 determine that the error is not greater than a threshold, control proceeds to block 1114. Otherwise, control proceeds to block 1110.

At block 1110, the PLL 100 and/or the PLL 400 increase a first range of time delays to a second range of time delays from which to select a time delay to delay the feedback clock signal. For example, the control circuitry 122 can configure (e.g., reconfigure) at least one of the MMD 118 or the DCDL 120 to generate time delay(s) in an increased time delay range. For example, the control circuitry 122 can reset the DCDL digital code 218 to 0 (or another low value) and/or generate the divider digital code 214 to increase a count threshold of the pulse swallow divider 212. In some embodiments, such configurations can increase the time delay range from 0 to $T_{VCO}$ to 0 to $2T_{VCO}$ as illustrated in the example of FIG. 3.

At block 1112, the PLL 100 and/or the PLL 400 delay the feedback clock signal using the time delay to reduce the error. For example, the MMD 118 and/or the DCDL 120 can delay the clock signal 206 by a time delay up to a time delay range of $2T_{VCO}$, $3T_{VCO}$, etc.

At block 1114, the PLL 100 and/or the PLL 400 determine whether to continue monitoring for the reference clock signal. If, at block 1114, the PLL 100 and/or the PLL 400 determine to continue monitoring for the reference clock signal, control returns to block 1102. Otherwise, the flowchart 1100 of FIG. 11 concludes.

Embodiments have been described where the techniques are implemented in circuitry and/or machine-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

The phrase "and/or," as used herein in the specification and in the claims, should be understood to mean "either or both," of the elements so conjoined, e.g., elements that are conjunctively present in some cases and disjunctively present in other cases. Multiple elements listed with "and/or" should be construed in the same fashion, e.g., "one or more" of the elements so conjoined. Other elements may optionally be present other than the elements specifically identified by the "and/or" clause, whether related or unrelated to those elements specifically identified. Thus, as a non-limiting example, a reference to "A and/or B," when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

The indefinite articles "a" and "an," as used herein in the specification and in the claims, unless clearly indicated to the contrary, should be understood to mean "at least one."

As used herein in the specification and in the claims, the phrase, "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently, "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

All definitions, as defined and used herein, should be understood to control over dictionary definitions, definitions in documents incorporated by reference, and/or ordinary meanings of the defined terms.

The word "exemplary" is used herein to mean serving as an example, instance, or illustration. Any embodiment, implementation, process, feature, etc., described herein as exemplary should therefore be understood to be an illustrative example and should not be understood to be a preferred or advantageous example unless otherwise indicated.

Having thus described several aspects of at least one embodiment, it is to be appreciated that various alterations, modifications, and improvements will readily occur to those skilled in the art. Such alterations, modifications, and improvements are intended to be part of this disclosure and are intended to be within the spirit and scope of the principles described herein. Accordingly, the foregoing description and drawings are by way of example only.

What is claimed is:

1. An apparatus for duty cycle error calibration, comprising:
   a multi-modulus divider (MMD) circuit with an output, the MMD circuit configured to:
      receive a first digital code corresponding to a first time delay, the first digital code included in a first plurality of digital codes associated with a first range of time delays;
      divide a clock signal by a divisor to generate a divided clock signal; and
      delay the divided clock signal by the first time delay to generate a delayed clock signal; and
   a digitally controlled delay line (DCDL) circuit with an input coupled to the output, the DCDL circuit configured to:
      receive a second digital code corresponding to a second time delay, the second digital code included in a second plurality of digital codes associated with a second range of time delays; and
      delay the delayed clock signal by the second time delay to generate a feedback clock signal, the feedback clock signal to cause a reduction of a difference between a reference clock signal and the feedback clock signal.

2. The apparatus of claim 1, wherein the difference is representative of an error generated by duty cycle distortion associated with the clock signal, and the DCDL circuit is configured to generate the feedback clock signal to reduce the error.

3. The apparatus of claim 1, wherein the output is a divider output, and the MMD circuit comprises:
   a divisor circuit with a divisor input and a divisor output, the divisor circuit configured to:
      receive the clock signal; and
      divide the clock signal by the divisor to generate the divided clock signal; and
   a pulse swallow divider circuit with a divider input and the divider output, the divider input coupled to the divisor output, the divider output coupled to the input of the DCDL circuit, and the pulse swallow divider circuit is configured to:
      receive the first digital code representative of a count threshold corresponding to the first time delay, the count threshold representative of a count of pulses of the clock signal;
      determine whether a count of received pulses of the clock signal satisfies the count threshold; and
      output the delayed clock signal to the DCDL circuit after a determination that the count of received pulses satisfies the count threshold.

4. The apparatus of claim 1, wherein at least one of the MMD circuit or the DCDL circuit comprises at least a portion of a phase-locked loop.

5. The apparatus of claim 1, further comprising a retimer circuit with a retimer input and a retimer output, the retimer input coupled to the output of the MMD circuit, the retimer output coupled to the DCDL input, and the MMD circuit is configured to be coupled to the DCDL circuit through the retimer circuit.

6. The apparatus of claim 5, wherein the DCDL circuit is configured to delay the second delayed clock signal by the second time delay in response to a first determination to bypass the retimer circuit, and the retimer circuit is configured to, in response to a second determination to route the first delayed clock signal through the retimer circuit:
   receive a third digital code corresponding to a third time delay; and
   delay the delayed clock signal by the third time delay to generate a retimed clock signal; and wherein
   the DCDL circuit is configured to delay the retimed clock signal by the second time delay or a fourth time delay in the second range of time delays to generate the feedback clock signal.

7. The apparatus of claim 6, further comprising digital logic configured to at least one of:
   output the first digital code to the MMD circuit;
   output the second digital code to the DCDL circuit; or
   output the third digital code to the retimer circuit.

8. The apparatus of claim 6, wherein the retimed clock signal is a first retimed clock signal, and the retimer circuit comprises:
   a flip-flop circuit with a flip-flop input and a flip-flop output, the flip-flop circuit configured to generate a second retimed clock signal by delaying the delayed clock signal by a clock cycle; and
   a multiplexer circuit with a first multiplexer input and a second multiplexer input, the first multiplexer input coupled to the output of the MMD circuit, the second multiplexer input coupled to the first flip-flop output, and the multiplexer circuit is configured to:
      select the delayed clock signal from the MMD circuit, the delayed clock signal associated with a combination of the first time delay and the second time delay; or
      select the second retimed clock signal from the flip-flop circuit, the selection of the second retimed clock signal associated with a combination of the first time delay, the second time delay, and the third time delay.

9. The apparatus of claim 8, wherein the flip-flop circuit is a first flip-flop circuit, the flip-flop input is a first flip-flop input, the flip-flop output is a first flip-flop output, and the retimer circuit comprises:
   a second flip-flop circuit with a second flip-flop input and a second flip-flop output, the first flip-flop input coupled to a multiplexer output of the multiplexer circuit, the second flip-flop output coupled to the input of the DCDL circuit.

10. The apparatus of claim 1, wherein the MMD circuit comprises an MMD input that is configured to be coupled to an output of a voltage-controlled oscillator, and the DCDL circuit comprises a DCDL output that is configured to be coupled to an input of a phase detector associated with a frequency doubler circuit.

11. The apparatus of claim 1, wherein the input is a first DCDL input, the DCDL circuit comprises a DCDL output, and the apparatus further comprising:
   a frequency doubler circuit with a frequency doubler input and a frequency doubler output;
   a phase detector circuit with a first phase detector input, a second phase detector input, and a phase detector output, the first phase detector input coupled to the frequency doubler output, the second phase detector input coupled to the DCDL output;
   a filter circuit with a filter input and a filter output, the filter input coupled to the phase detector output;
   an oscillator circuit with an oscillator input and an oscillator output, the oscillator input coupled to the filter output, the oscillator output coupled to the DCDL input; and
   a control circuit with a control input, a first control output, and a second control output, the control input coupled to the phase detector output, the first control output coupled to a second DCDL input of the DCDL circuit, and the second control output is coupled to an MMD input of the MMD circuit.

12. The apparatus of claim 1, wherein the input is a DCDL input, the DCDL circuit comprises a DCDL output, the reference clock signal is a doubled reference clock signal, and the apparatus further comprising:
a frequency doubler circuit with a frequency doubler input and a frequency doubler output, the frequency doubler circuit configured to:
receive a reference clock signal; and
double a frequency of the reference clock signal to generate the doubled reference clock signal;
a phase detector circuit with a first phase detector input, a second phase detector input, and a phase detector output, the first phase detector input coupled to the frequency doubler output, the second phase detector input coupled to the DCDL output, and the phase detector circuit is configured to generate an error signal representative of an error associated with the difference between the doubled reference clock signal and the feedback clock signal; and
a control circuit with a control input and a control output, the control input coupled to the phase detector output, and the control circuit is configured to:
determine to correct the error with at least one of the first time delay or the second time delay; and
generate the first digital code and the second digital code.

13. The apparatus of claim 1, further comprising:
a calibration circuit with a calibration output, the calibration circuit configured to translate an error signal generated by a phase detector into a first control signal; and
a fractional-N (Frac-N) circuit with a Frac-N input and a Frac-N output, the Frac-N input coupled to the calibration output, and the Frac-N circuit configured to generate at least one of a second control signal to control the MMD circuit or a third control signal to control the DCDL circuit.

14. An apparatus for duty cycle error calibration, comprising:
a multi-modulus divider (MMD) circuit with an MMD output, the MMD circuit configured to generate a first delayed clock signal by delaying a clock signal by a first time delay associated with a first range of time delays;
a retimer circuit with a retimer input and a retimer output, the retimer input coupled to the MMD output, the retimer circuit configured to generate a second delayed clock signal by delaying the first delayed clock signal by a second time delay associated with a second range of time delays; and
a digitally controlled delay line (DCDL) circuit with a DCDL input coupled to the retimer output, the DCDL circuit configured to generate a third delayed clock signal by a third time delay associated with a third range of time delays.

15. The apparatus of claim 14, wherein the first time delay range, the second time delay range, and the third time delay range are the same.

16. The apparatus of claim 14, wherein the MMD circuit, the retimer circuit, and the DCDL circuit are configured to cause the clock signal to be delayed based on a combination of the first time delay, the second time delay, and the third time delay.

17. The apparatus of claim 15, wherein at least one of:
the MMD circuit is configured to cause the first time delay in response to receiving a first digital code corresponding to the first time delay;
the retimer circuit is configured to cause the second time delay in response to receiving a second digital code corresponding to the second time delay; or
the DCDL circuit is configured to cause the third time delay in response to receiving a third digital code corresponding to the first time delay.

18. A method for duty cycle error calibration, comprising:
receiving a reference clock signal;
comparing the reference clock signal and a feedback clock signal to detect an error;
in response to detecting the error based on the comparing, determining whether the error is greater than a threshold; and
in response to determining that the error is greater than the threshold:
increasing a first range of time delays to a second range of time delays from which to select a time delay to delay the feedback clock signal; and
delaying the feedback clock signal using the time delay to reduce the error.

19. The method of claim 18, wherein the time delay is a first time delay, and the method further comprising, in response to determining that the error is less than the threshold, delaying the feedback clock signal using a second time delay in the first range of time delays.

20. The method of claim 18, wherein the threshold is a first threshold, the time delay is a first time delay, and the method further comprising:
in response to determining that the error is greater than a second threshold:
increasing the first range of time delays to a third range of time delays, greater than the second range of time delays; and
delaying the feedback clock signal using a second time delay in the third range of time delays.

* * * * *